(12) United States Patent
Yoshida

(10) Patent No.: US 11,882,698 B2
(45) Date of Patent: Jan. 23, 2024

(54) SEMICONDUCTOR MEMORY DEVICE

(71) Applicant: Kioxia Corporation, Minato-ku (JP)

(72) Inventor: Kiyomitsu Yoshida, Kuwana (JP)

(73) Assignee: Kioxia Corporation, Minato-ku (JP)

( * ) Notice: Subject to any disclaimer, the term of this patent is extended or adjusted under 35 U.S.C. 154(b) by 203 days.

(21) Appl. No.: 17/005,514

(22) Filed: Aug. 28, 2020

(65) Prior Publication Data

US 2021/0082945 A1 Mar. 18, 2021

(30) Foreign Application Priority Data

Sep. 17, 2019 (JP) ................................. 2019-168372

(51) Int. Cl.
*H10B 43/20* (2023.01)
*H01L 23/522* (2006.01)
*H10B 43/10* (2023.01)
*H10B 43/35* (2023.01)
*H10B 43/40* (2023.01)

(52) U.S. Cl.
CPC ......... *H10B 43/20* (2023.02); *H01L 23/5226* (2013.01); *H10B 43/10* (2023.02); *H10B 43/35* (2023.02); *H10B 43/40* (2023.02)

(58) Field of Classification Search
CPC ........... H01L 27/11582; H01L 27/1157; H01L 27/11556; H01L 27/11565; H01L 27/11573; H01L 21/76804; H01L 21/76805; H01L 21/76831; H10B 43/10; H10B 43/20; H10B 43/27
See application file for complete search history.

(56) References Cited

U.S. PATENT DOCUMENTS

| 10,090,315 | B2 | 10/2018 | Fukuzumi et al. |
| 2009/0267128 | A1 | 10/2009 | Maejima |
| 2009/0268522 | A1 | 10/2009 | Maejima |
| 2010/0032725 | A1 | 2/2010 | Baba et al. |
| 2010/0207195 | A1 | 8/2010 | Fukuzumi et al. |
| 2011/0284946 | A1 | 11/2011 | Kiyotoshi |
| 2020/0402579 | A1* | 12/2020 | Park ........................ H01L 24/08 |

FOREIGN PATENT DOCUMENTS

| CN | 109346478 A | 2/2019 |
| JP | 2016-062901 A | 4/2016 |
| TW | 201409617 A | 3/2014 |
| TW | 201826507 A | 7/2018 |

* cited by examiner

*Primary Examiner* — Tony Tran
(74) *Attorney, Agent, or Firm* — Oblon, McClelland, Maier & Neustadt, L.L.P.

(57) ABSTRACT

According to one embodiment, a semiconductor memory device includes a first insulating layer; a first conductive layer provided in the first insulating layer and extending in the first direction; a second conductive layer extending in the first direction and provided adjacent to the first conductive layer in a second direction; and a contact plug coupled to one surface of the first conductive layer in a third direction. Thicknesses in the third direction of portions of the first and second conductive layers that overlap the contact plug in the third direction are smaller than thicknesses in the third direction of portions of the first and second conductive layers that do not overlap the contact plug in the third direction.

12 Claims, 22 Drawing Sheets

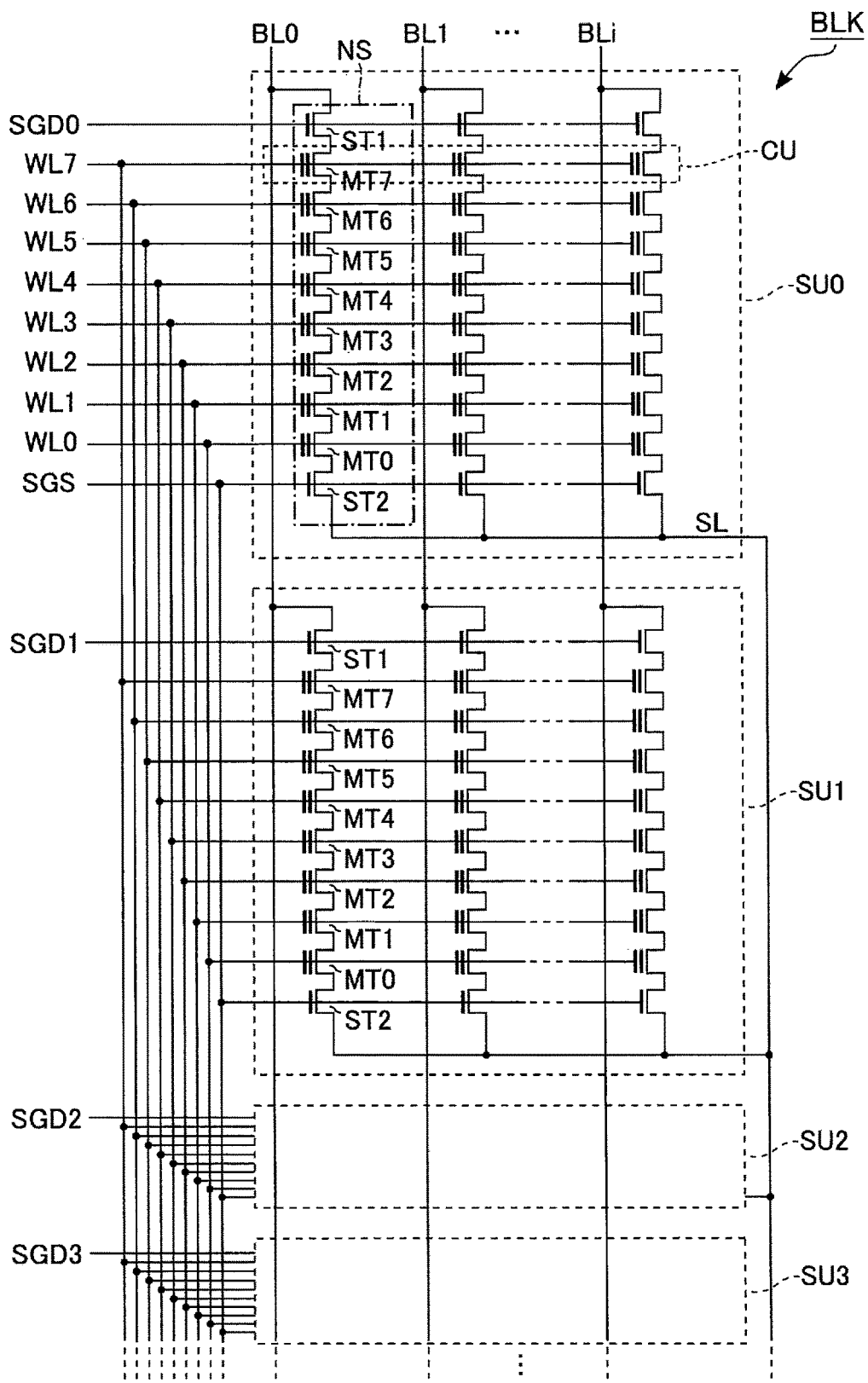
F I G. 2

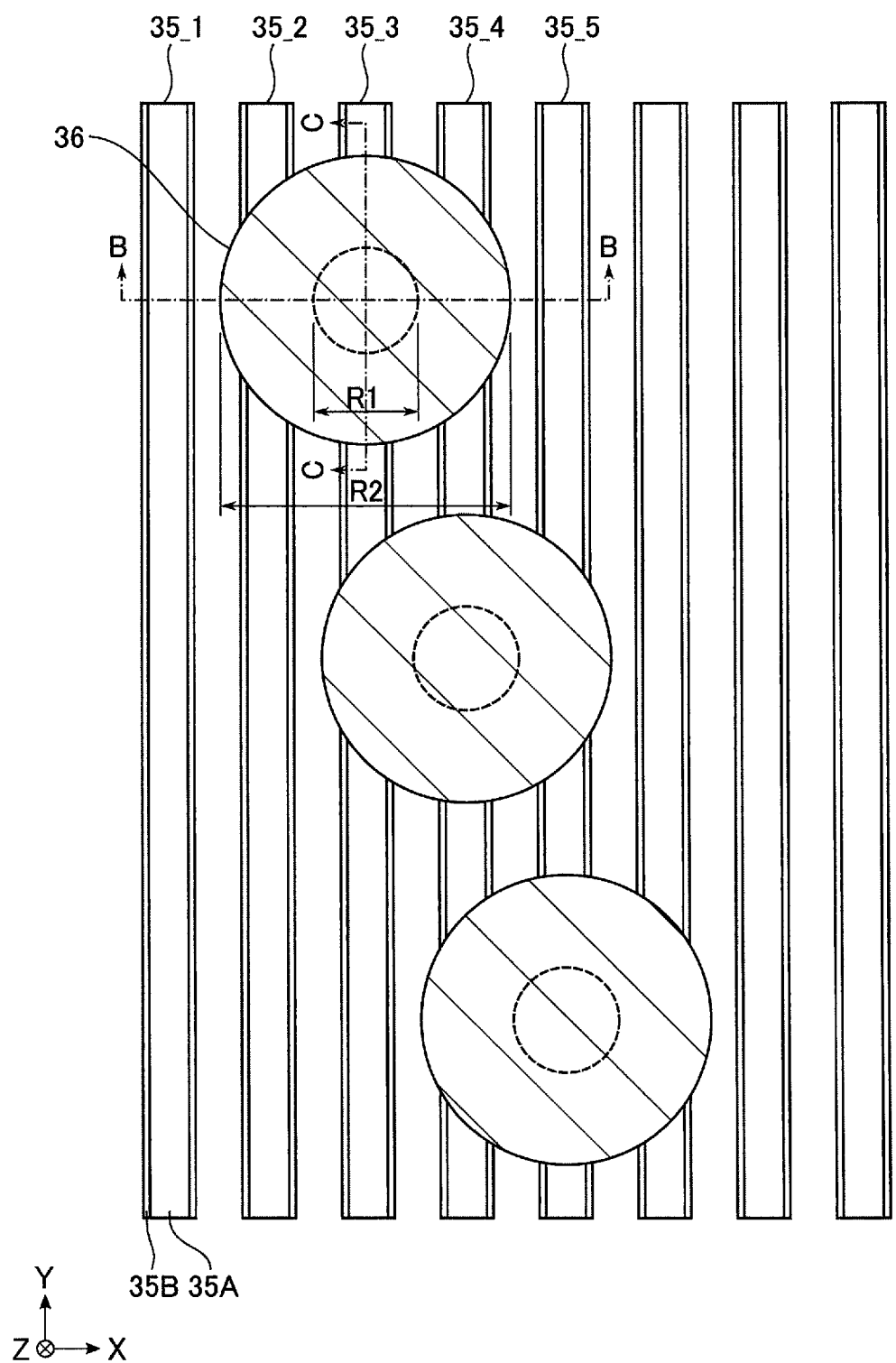
F I G. 6

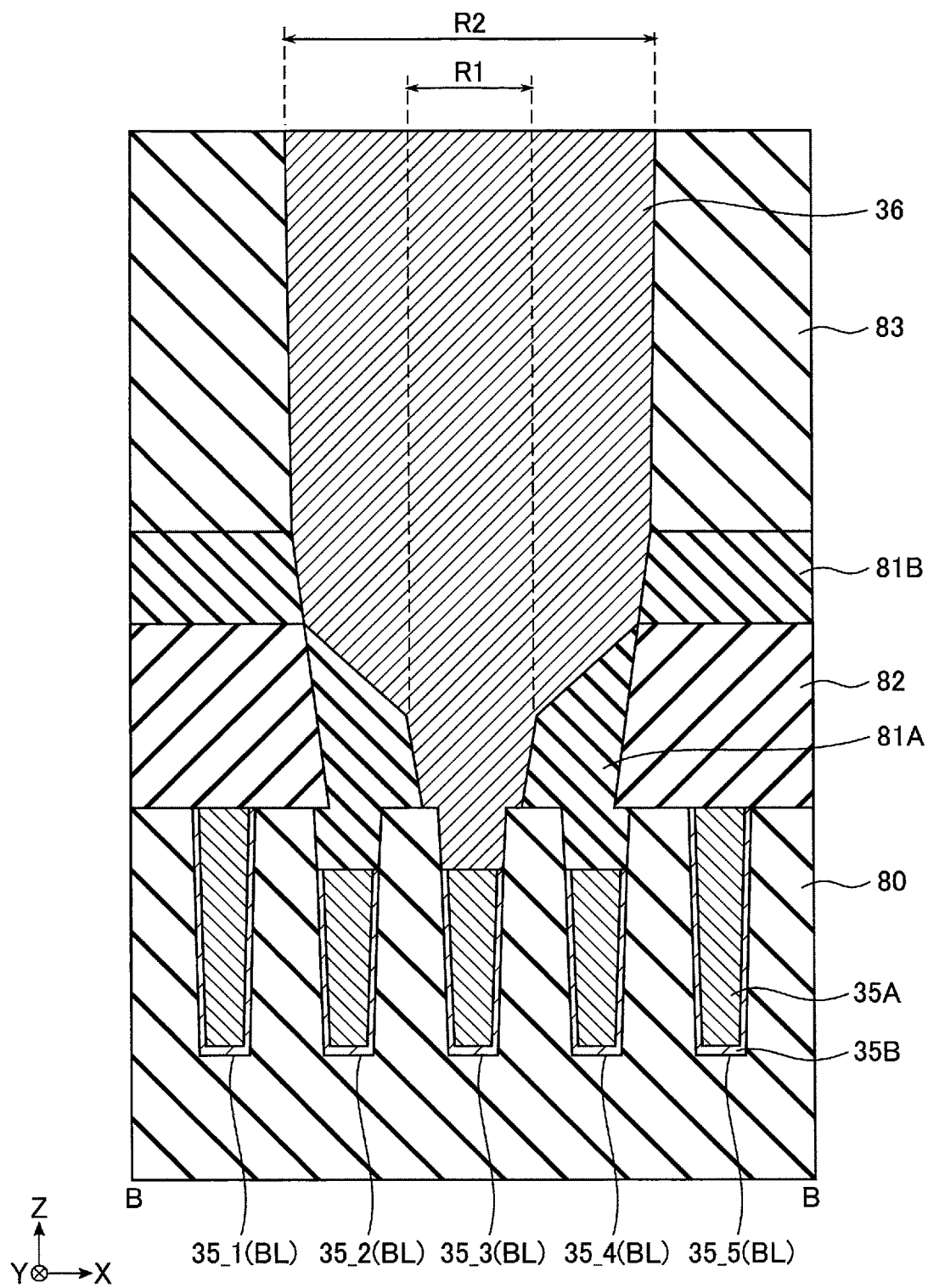
F I G. 7

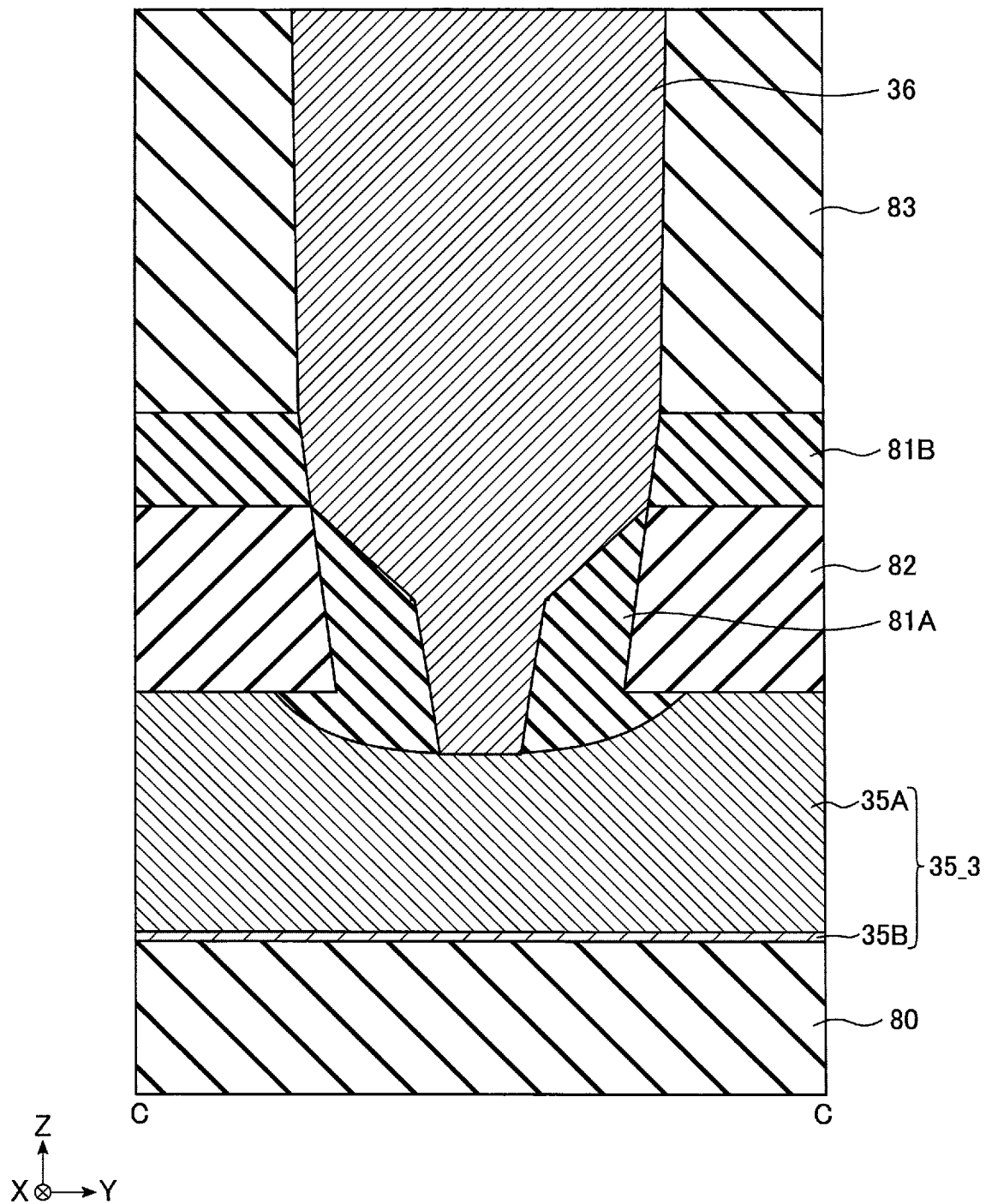
F I G. 8

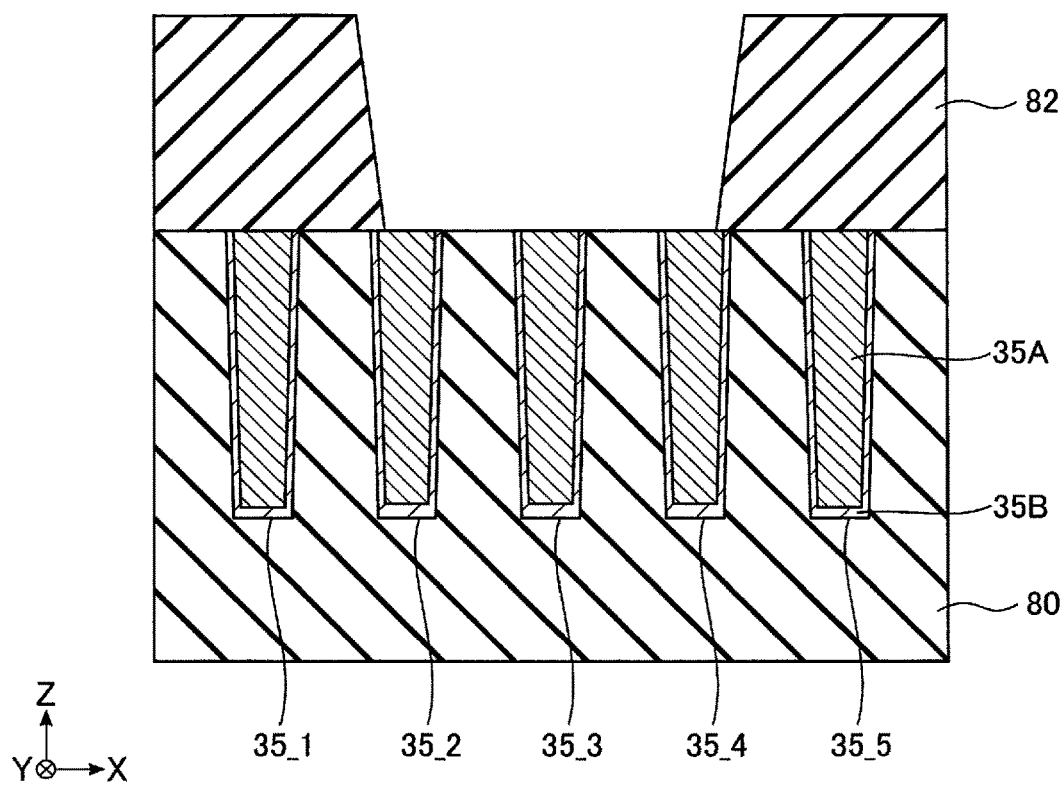
F I G. 13
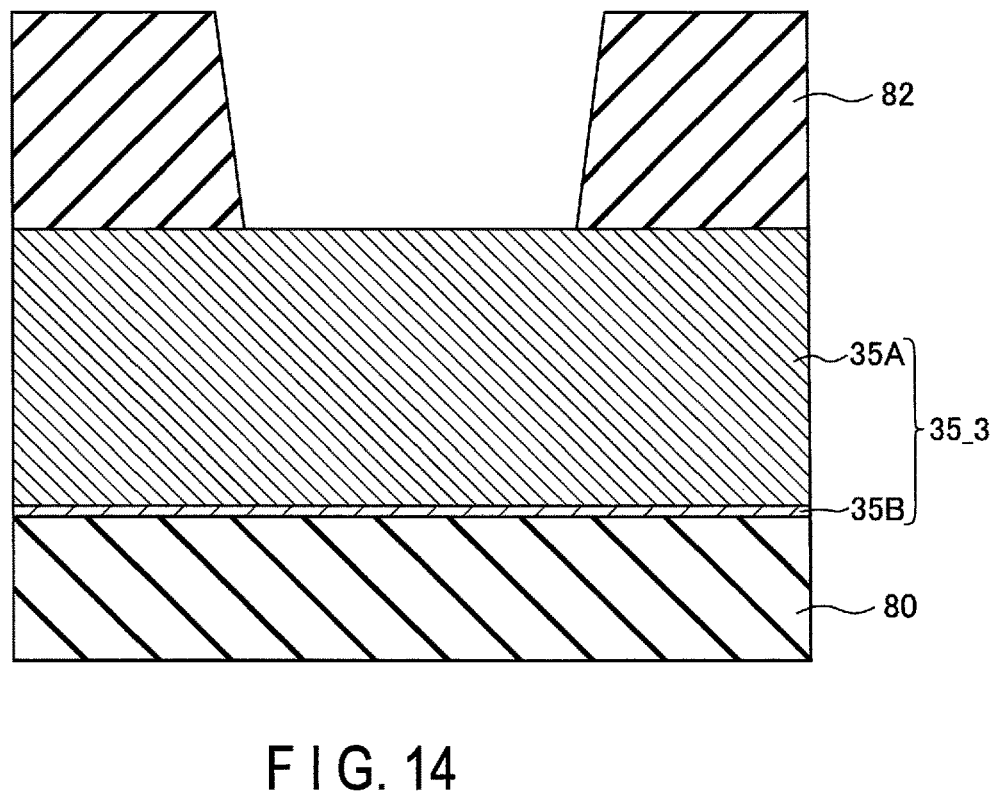
F I G. 14

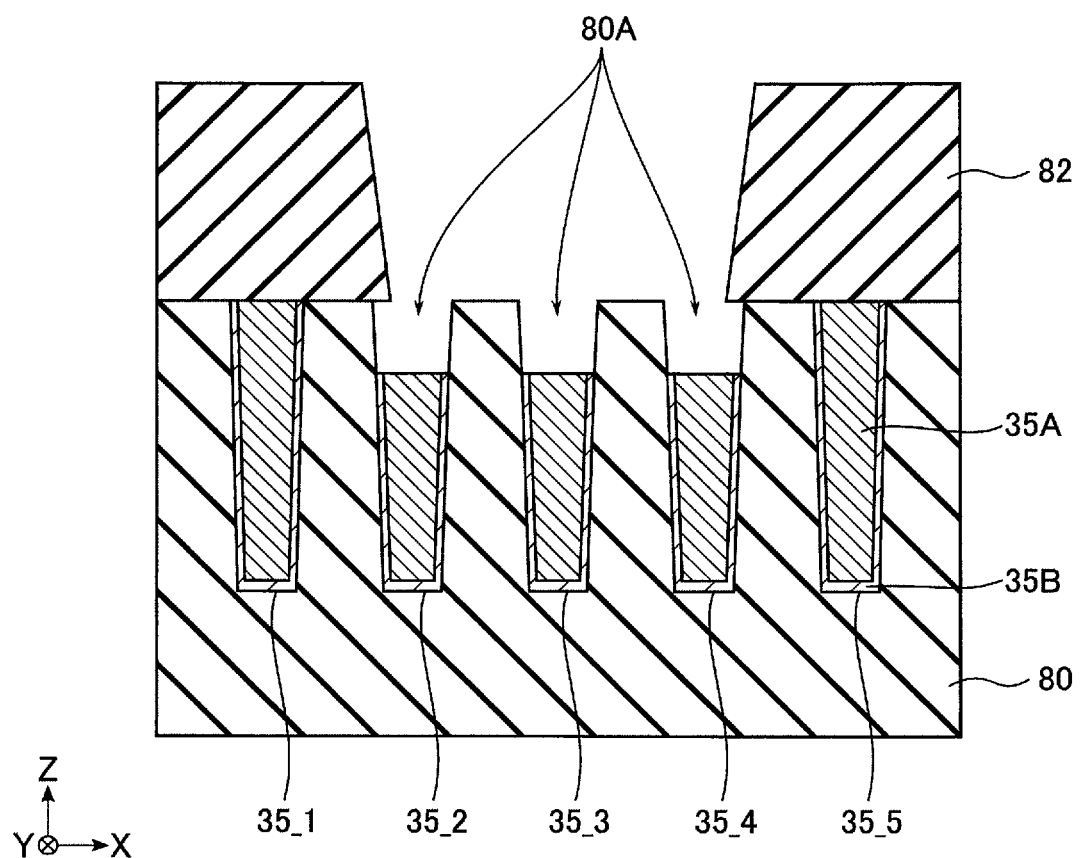
F I G. 15

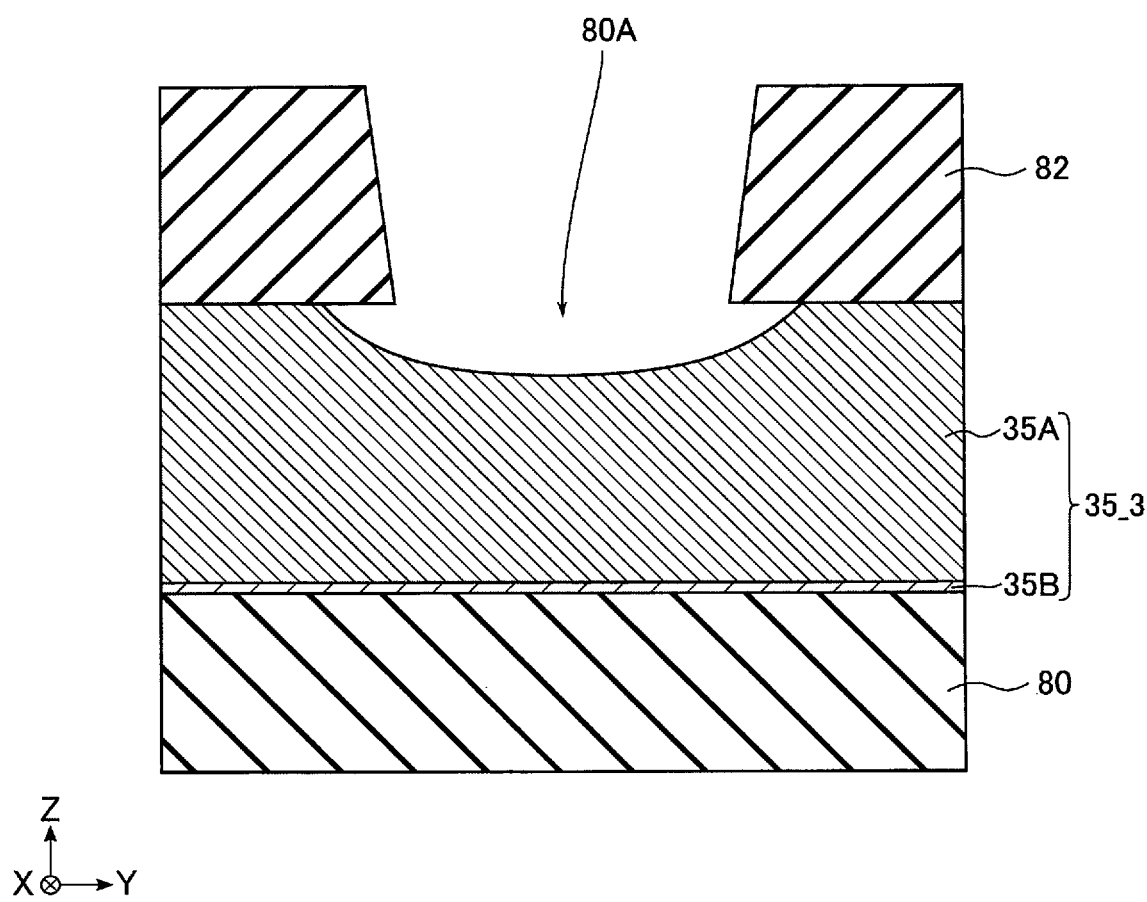
F I G. 16

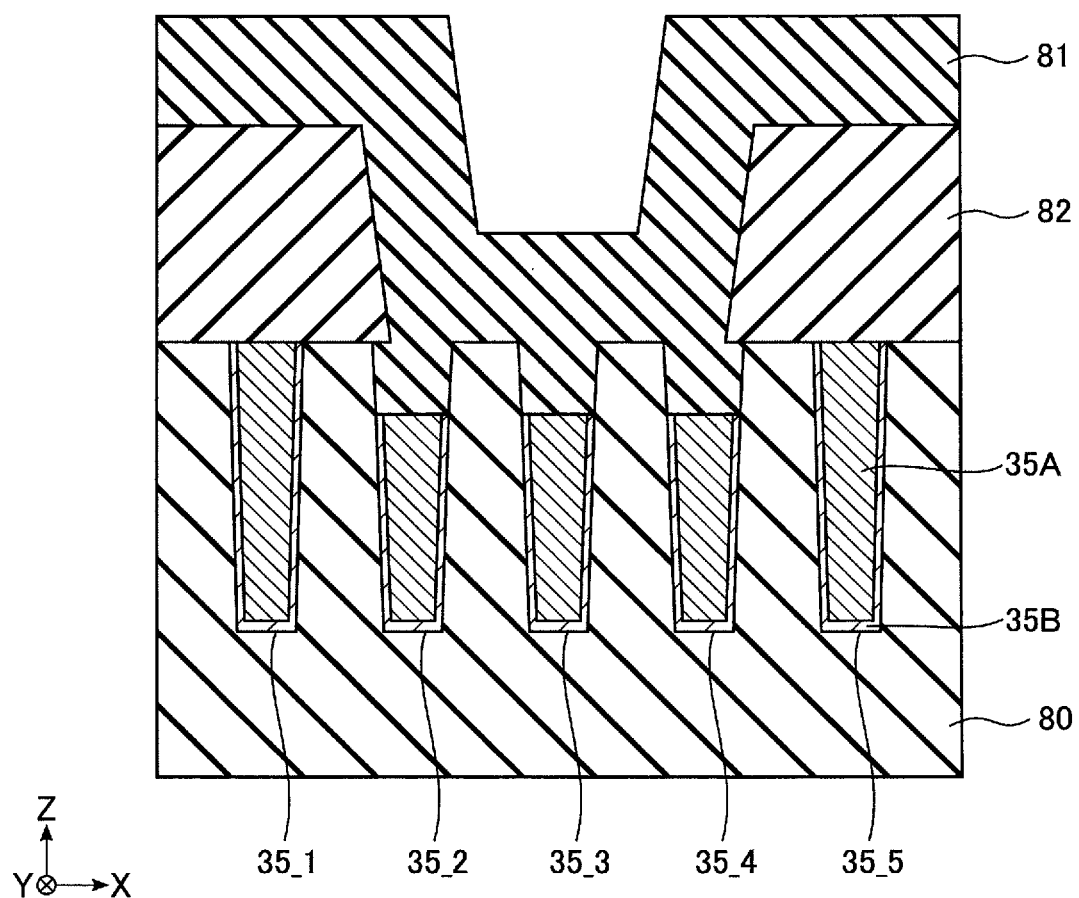
F I G. 17

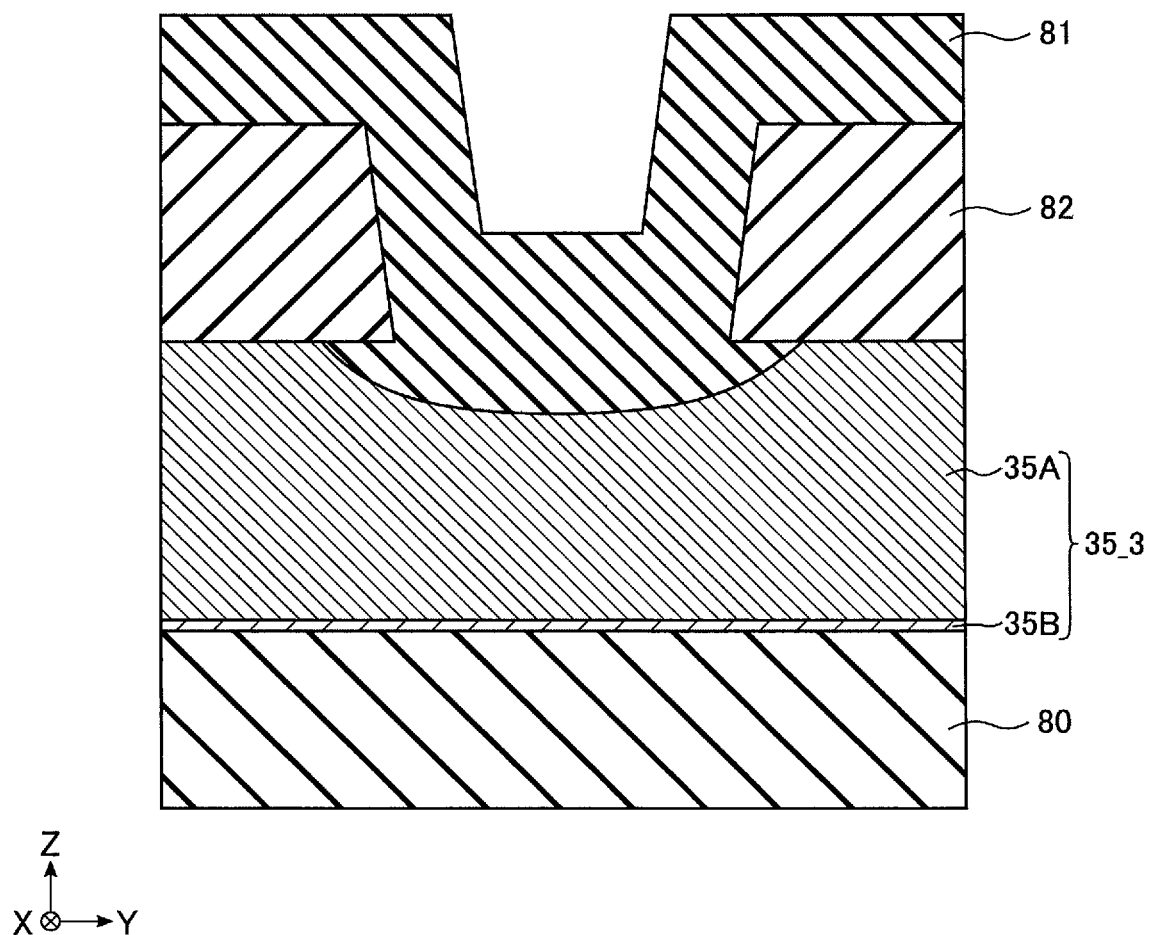
F I G. 18

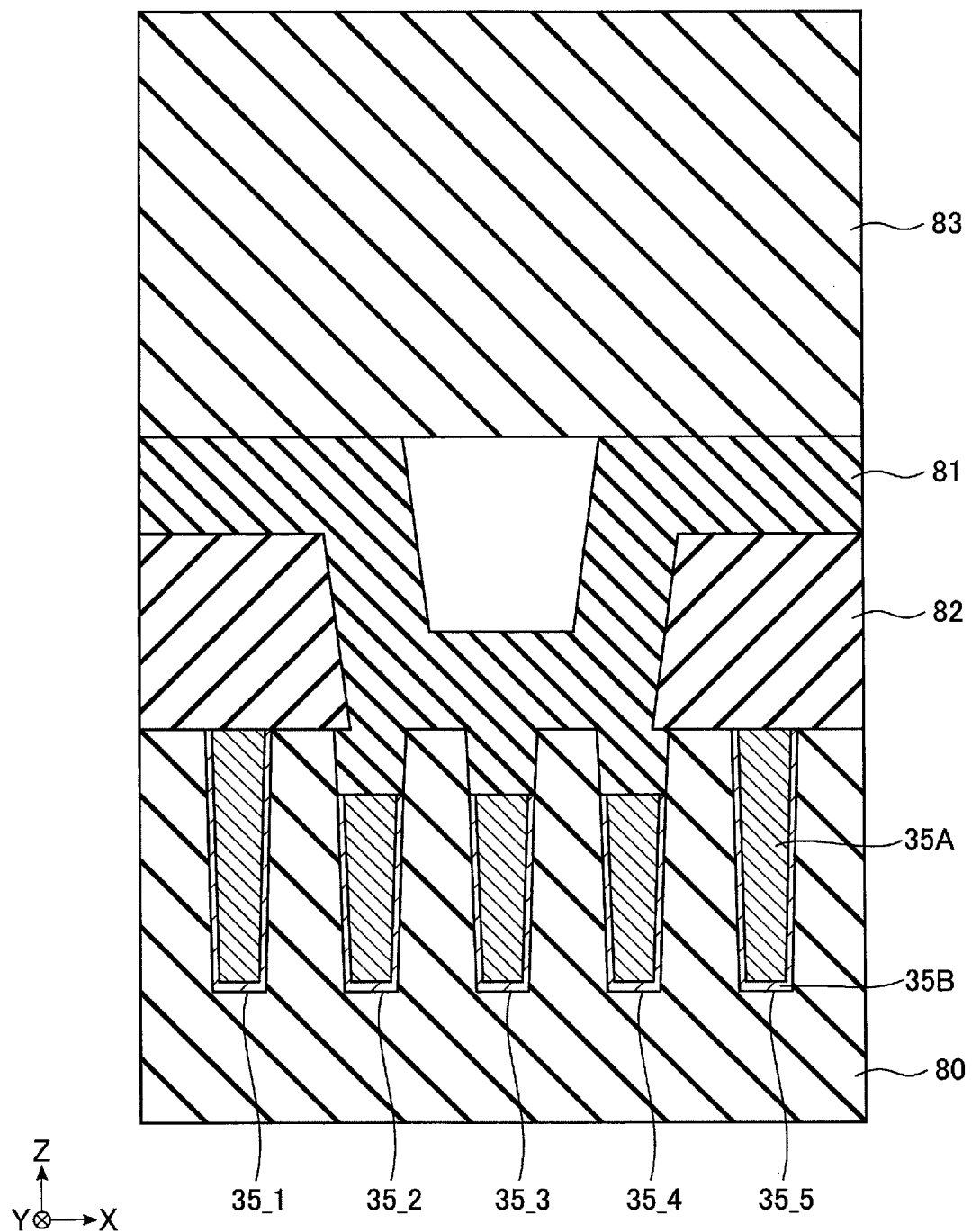
F I G. 19

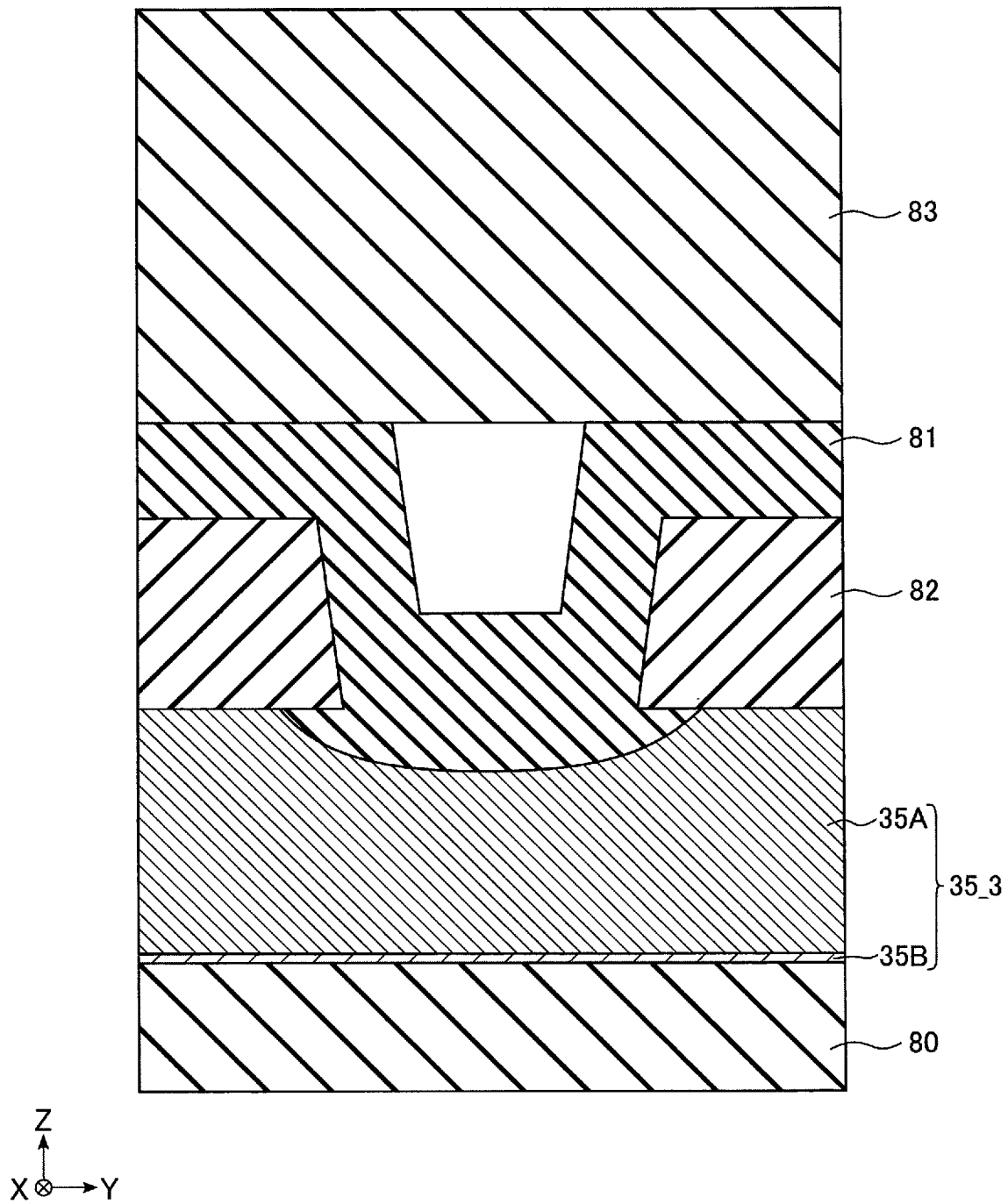
F I G. 20

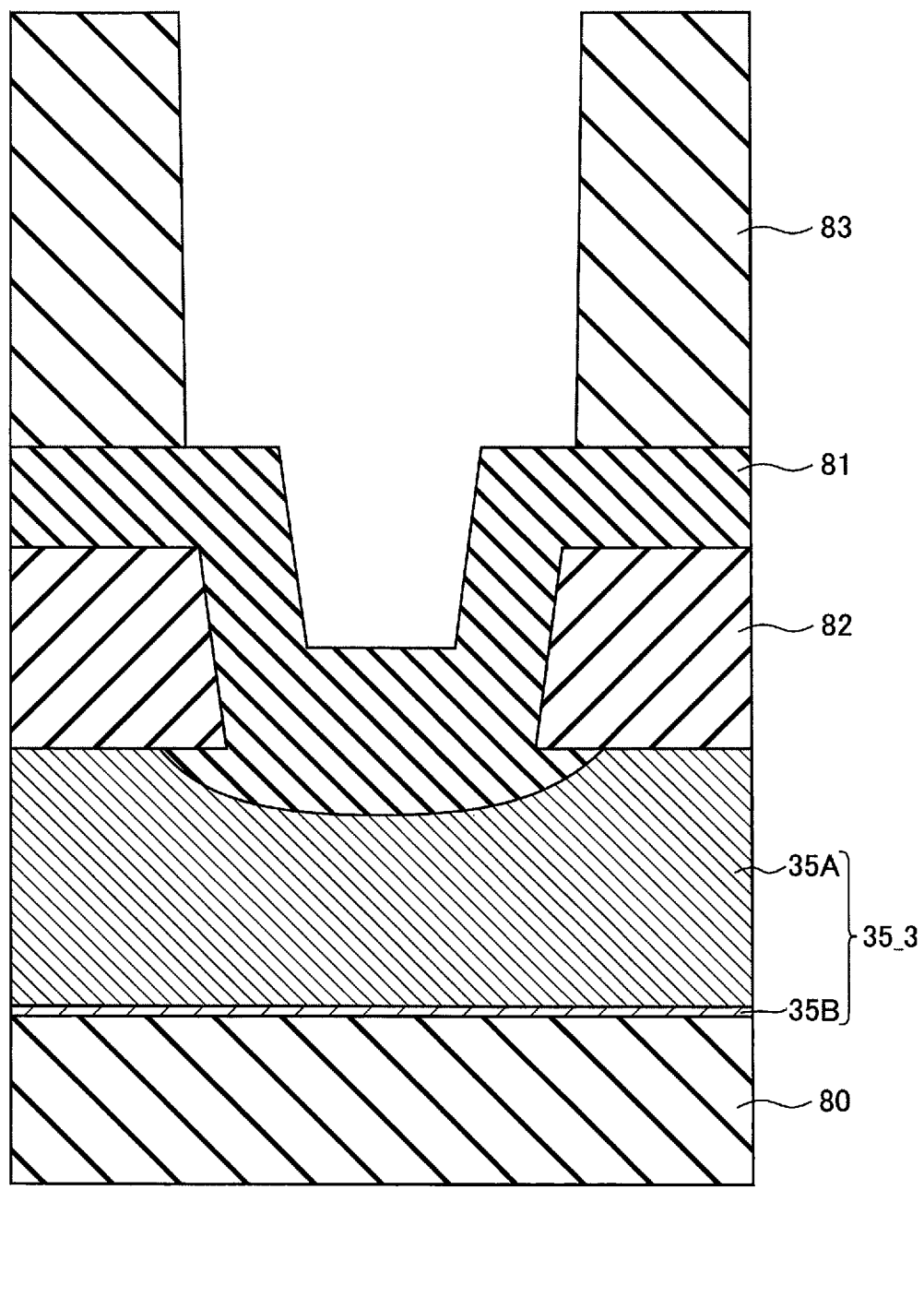
F I G. 22

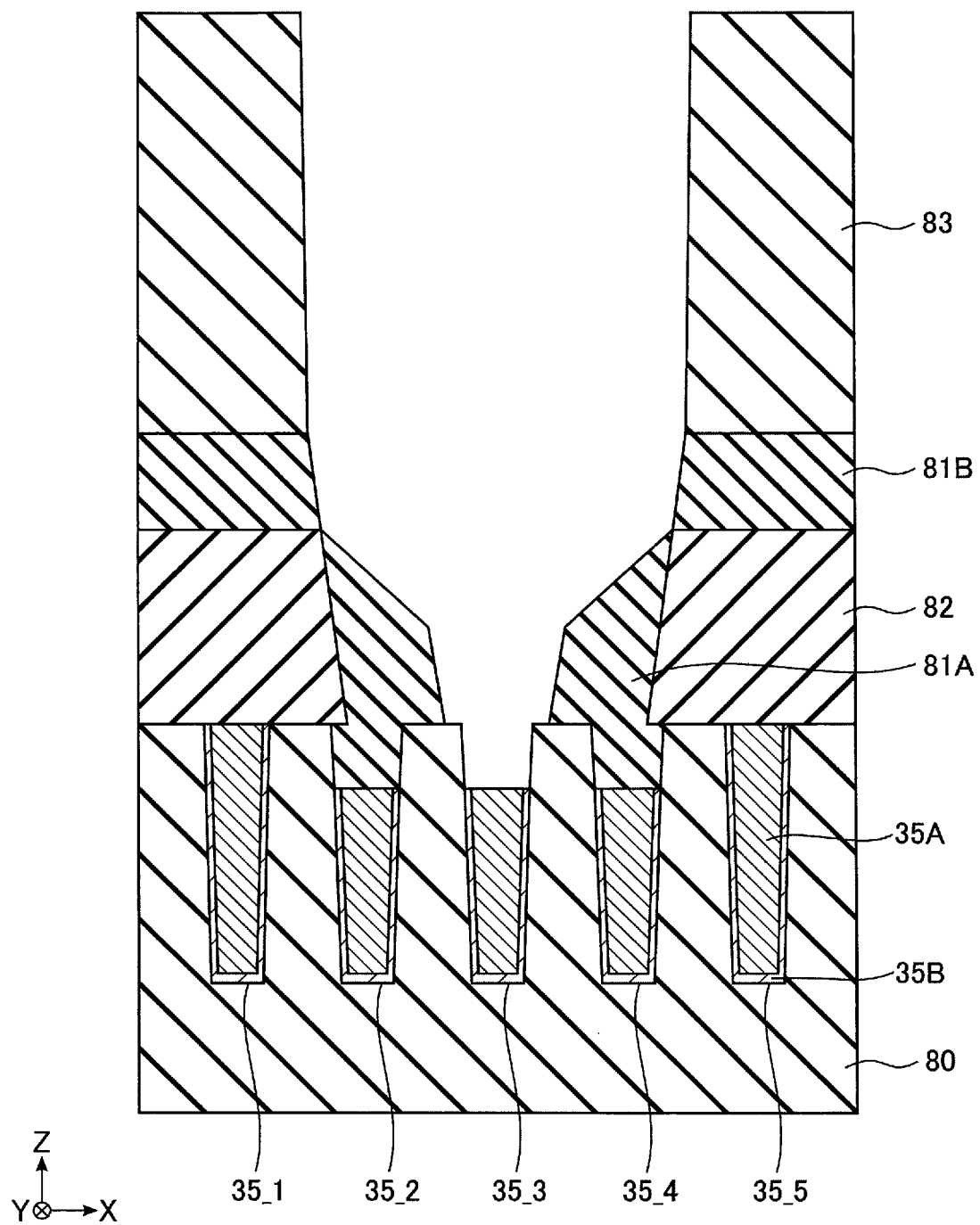
F I G. 23

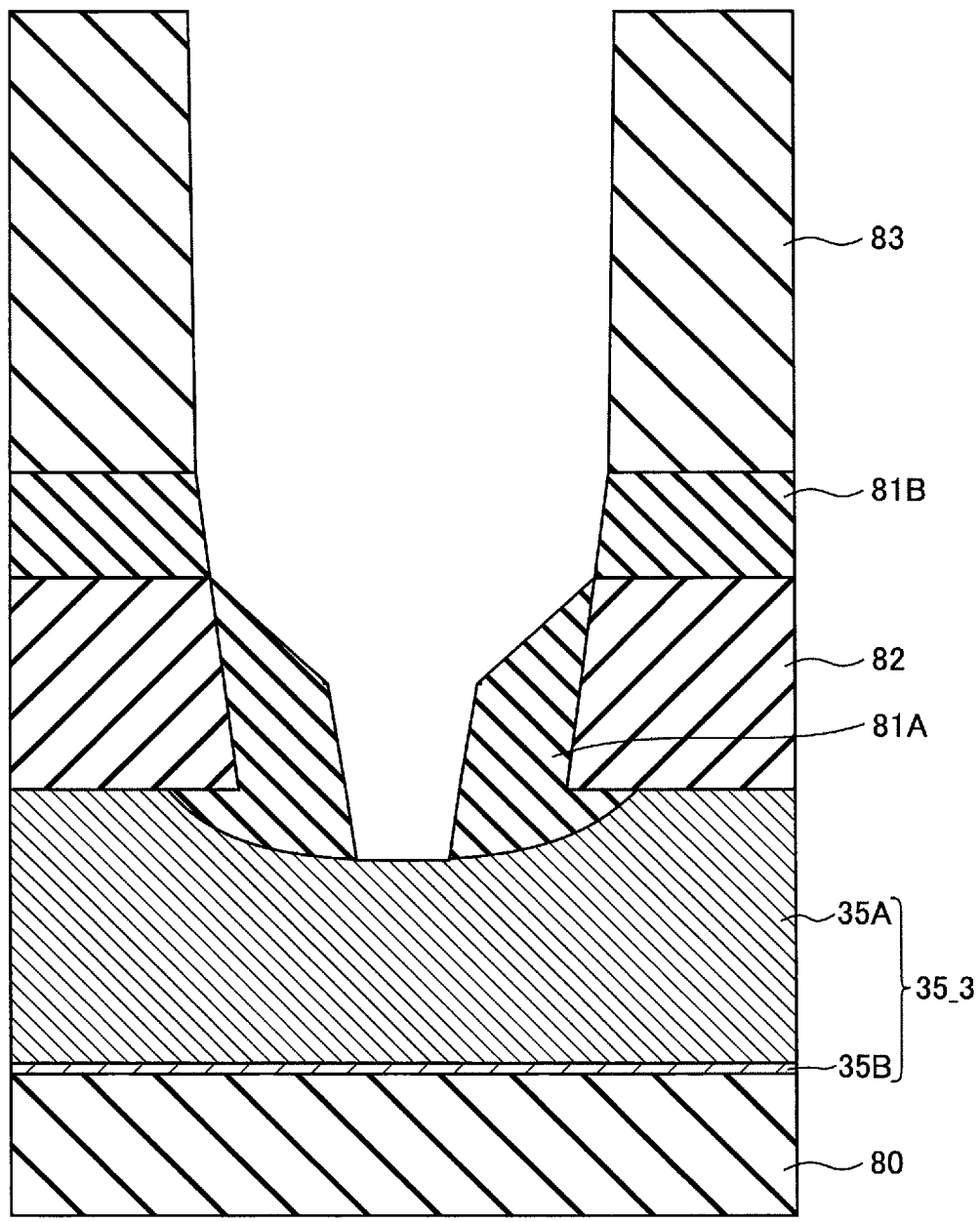
F I G. 24

SEMICONDUCTOR MEMORY DEVICE

CROSS-REFERENCE TO RELATED APPLICATIONS

This application is based upon and claims the benefit of priority from the Japanese Patent Application No. 2019-168372, filed Sep. 17, 2019, the entire contents of which are incorporated herein by reference.

FIELD

Embodiments described herein relate generally to a semiconductor memory device.

BACKGROUND

A semiconductor memory device including three-dimensionally arranged memory cells is known.

BRIEF DESCRIPTION OF THE DRAWINGS

FIG. 2 is a circuit diagram of a block in a memory cell array according to the embodiment.

FIG. 6 is a plane view of conductive layers and vias in the semiconductor memory device according to the embodiment.

FIG. 7 is a cross-sectional view taken along line B-B of FIG. 6.

FIG. 8 is a cross-sectional view taken along line C-C of FIG. 6.

FIGS. 9 to 24 are cross-sectional views showing a method of manufacturing conductive layers and vias in the semiconductor memory device according to the embodiment.

DETAILED DESCRIPTION

Figure 1:
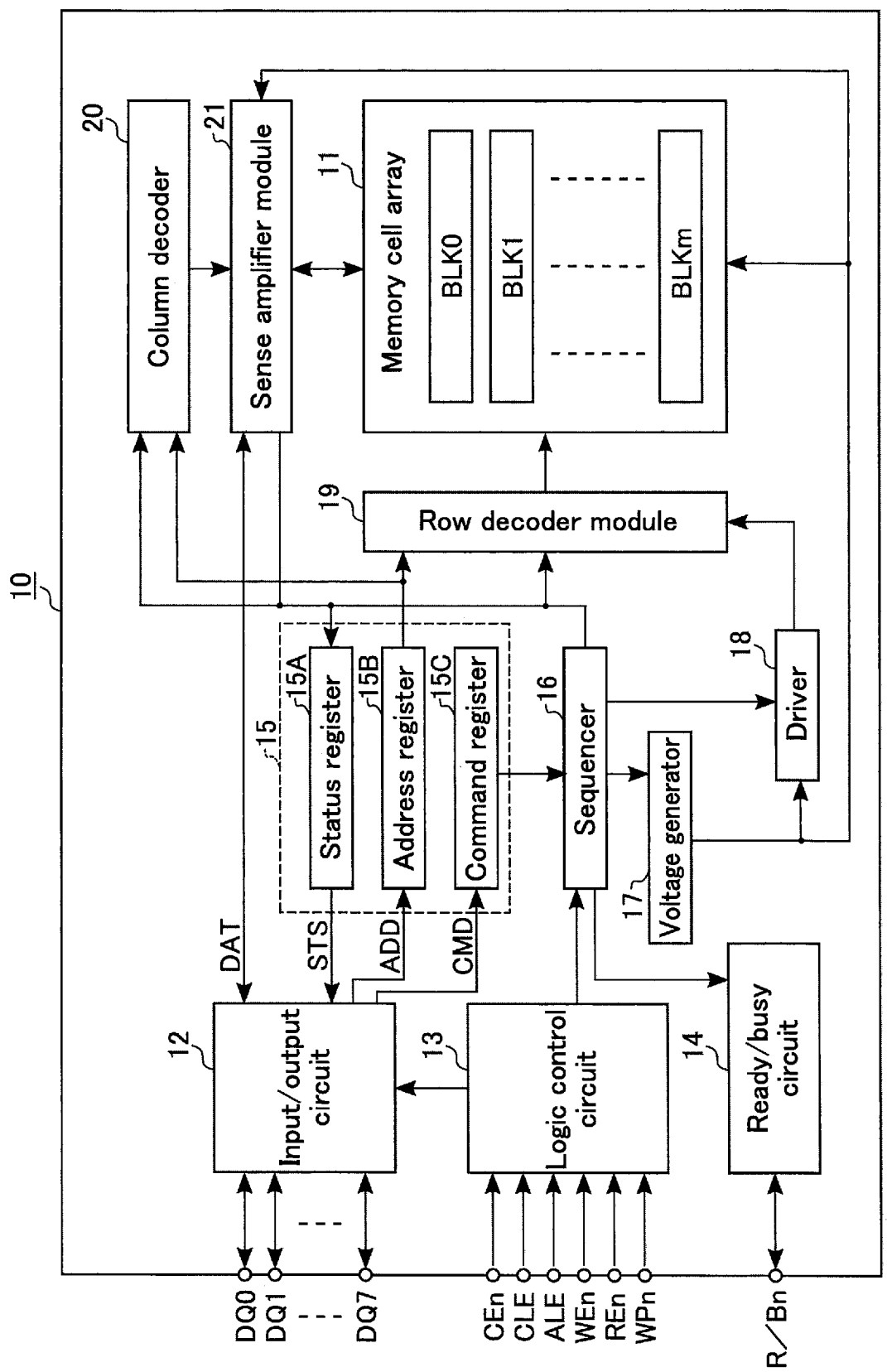
FIG. 1 is a block diagram showing a circuit configuration of a semiconductor memory device according to an embodiment.

In general, according to one embodiment, a semiconductor memory device includes a first insulating layer; a first conductive layer provided in the first insulating layer and extending in the first direction; a second conductive layer extending in the first direction and provided adjacent to the first conductive layer in a second direction intersecting the first direction; and a contact plug coupled to one surface of the first conductive layer in a third direction intersecting the first and second directions. Thicknesses in the third direction of portions of the first and second conductive layers that overlap the contact plug in the third direction are smaller than thicknesses in the third direction of portions of the first and second conductive layers that do not overlap the contact plug in the third direction.

Embodiments will be described with reference to the accompanying drawings. In the description that follows, components having the same function and configuration will be assigned a common reference numeral. The embodiments to be described below are shown as an example of a device or a method for embodying the technical idea of the embodiments, and are not intended to limit the material, shape, structure, arrangement, etc. of components to those described below.

In the description that follows, a three-dimensional NAND flash memory including memory cell transistors stacked above a semiconductor substrate will be taken as an example. Herein, a memory cell transistor may also be referred to as a "memory cell".

1. Embodiment

Hereinafter, a description will be given of a semiconductor memory device according to an embodiment. A circuit configuration of the semiconductor memory device will be described first, and then a structure of the semiconductor memory device will be described.

1. 1 Circuit Configuration of Semiconductor Memory Device

A circuit block configuration of a semiconductor memory device according to the embodiment will be described with reference to FIG. 1. FIG. 1 is a block diagram showing a circuit configuration of a semiconductor memory device according to the embodiment.

A semiconductor memory device 10 includes a memory cell array 11, an input/output circuit 12, a logic control circuit 13, a ready/busy circuit 14, a register group 15, a sequencer (or a control circuit) 16, a voltage generator 17, a driver 18, a row decoder module (RD) 19, a column decoder 20, and a sense amplifier module 21. The register group 15 includes a status register 15A, an address register 15B, and a command register 15C.

The memory cell array 11 includes one or more blocks BLK0, BLK1, BLK2, . . . , and BLKm (where m is an integer equal to or greater than 0). Each of the blocks BLK includes a plurality of memory cell transistors each associated with a row and a column. The memory cell transistors are electrically rewritable, non-volatile memory cells. In the memory cell array 11, a plurality of word lines, a plurality of bit lines, a source line, etc. are provided to control voltages applied to the memory cell transistors. Hereinafter, let us assume that a "block BLK" refers to each of the blocks BLK0 to BLKm. A specific configuration of the block BLK will be described later.

The input/output circuit 12 and the logic control circuit 13 are coupled to an unillustrated external device (e.g., a memory controller) via a bus. The input/output circuit 12 transmits and receives a signal DQ (e.g., DQ0, DQ1, DQ2, . . . , DQ7) to and from the memory controller via the bus.

The logic control circuit 13 receives an external control signal from the memory controller via the bus. The external control signal includes, for example, a chip enable signal CEn, a command latch enable signal CLE, an address latch enable signal ALE, a write enable signal WEn, a read enable signal REn, and a write protect signal WPn. The symbol "n" assigned to the name of a signal indicates that the signal is active-low.

The chip enable signal CEn, which allows a semiconductor memory device (NAND flash memory) 10 to be selected, is asserted to select the semiconductor memory device 10. The command latch enable signal CLE allows a command transmitted as a signal DQ to be latched in the command register 15C. The address latch enable signal ALE allows an address transmitted as a signal DQ to be latched in the address register 15B. The write enable signal WEn allows data transmitted as a signal DQ to be stored in the input/output circuit 12. The read enable signal REn allows data read from the memory cell array 11 to be output as a signal DQ. The write protect signal WPn is asserted to prohibit writing and erasure to and from the semiconductor memory device 10.

The ready/busy circuit 14 generates a ready/busy signal R/Bn in response to control by the sequencer 16. The signal R/Bn indicates whether the semiconductor memory device 10 is in a ready state or a busy state. The ready state indicates that an instruction from the memory controller can be received. The busy state indicates that an instruction from the memory controller cannot be received. Through reception of the signal R/Bn from the semiconductor memory device 10, the memory controller perceives whether the semiconductor memory device 10 is in a ready state or in a busy state.

The status register 15A stores status information STS required for operations of the semiconductor memory device 10, and transfers the status information STS to the input/output circuit 12 based on an instruction from the sequencer 16. The address register 15B stores address information ADD transferred from the input/output circuit 12. The address information ADD contains a column address and a row address. The row address includes, for example, a block address that specifies a block BLK to be an operation target, and a page address that specifies a word line to be the operation target in the specified block. The command register 15C stores a command CMD transferred from the input/output circuit 12. The command CMD includes, for example, a write command that instructs a write operation to the sequencer 16, and a read command that instructs a read operation. The status register 15A, the address register 15B, and the command register 15C are configured by, for example, a static random access memory (SRAM).

The sequencer 16 receives a command from the command register 15C, and collectively controls the semiconductor memory device 10 in accordance with a sequence based on the received command. The sequencer 16 controls the row decoder module 19, the sense amplifier module 21, the voltage generator 17, etc., and performs a write operation, a read operation, and an erase operation.

Specifically, the sequencer 16 controls the row decoder module 19, the driver 18, and the sense amplifier module 21 based on a write command received from the command register 15C, and writes data to a plurality of memory cell transistors specified by address information ADD. Also, the sequencer 16 controls the row decoder module 19, the driver 18, and the sense amplifier module 21 based on a read command received from the command register 15C, and reads data from the memory cell transistors specified by the address information ADD.

The voltage generator 17 receives a power supply voltage from outside the semiconductor memory device 10, and generates voltages required for a write operation, a read operation, and an erase operation using the power supply voltage. The voltage generator 17 supplies the generated voltages to the memory cell array 11, the driver 18, and the sense amplifier module 21.

The driver 18 receives a plurality of voltages from the voltage generator 17. Of the voltages supplied from the voltage generator 17, the driver 18 supplies voltages respectively selected for a read operation, a write operation, and an erase operation to the row decoder module 19 via a plurality of signal lines.

The row decoder module 19 receives a row address from the address register 15B, and decodes the received row address. The row decoder module 19 selects one of the blocks BLK based on a decoded result of the row address, and selects a word line in the selected block BLK. The row decoder module 19 transfers the voltages supplied from the driver 18 to the selected block BLK.

The column decoder 20 receives a column address from the address register 15B, and decodes the received column address. The column decoder 20 selects a bit line based on the decoded result of the column address.

In a read operation of data, the sense amplifier module 21 detects and amplifies data read from a plurality of memory cell transistors to corresponding bit lines. The sense amplifier module 21 temporarily stores read data DAT read from the memory cell transistors, and transfers the read data DAT to the input/output circuit 12. During a write operation of data, the sense amplifier module 21 temporarily stores write data DAT transferred from the input/output circuit 12. The sense amplifier module 21 transfers the write data DAT to a corresponding bit line.

Next, a circuit configuration of the memory cell array 11 will be described with reference to FIG. 2. The memory cell array 11 includes a plurality of blocks BLK0 to BLKm, as described above. A description will be given of a circuit configuration of only a single block BLK; however, the configurations of the other blocks are similar thereto.

FIG. 2 is a circuit diagram of a single block BLK in the memory cell array 11. The block BLK includes, for example, a plurality of string units SU0, SU1, SU2, and SU3. Herein, as an example, the block BLK includes string units SU0 to SU3; however, the number of string units included in a block BLK may be designed to be any number.

Hereinafter, let us assume that a "string unit SU" refers to each of the string units SU0 to SU3.

Each of the string units SU0 to SU3 includes a plurality of NAND strings (or memory strings) NS. The number of NAND strings NS included in each string unit SU may be designed to be any number.

Each NAND string NS includes a plurality of memory cell transistors MT0, MT1, MT2, . . . , MT7, and select transistors ST1 and ST2. For simplicity of description, as an example, a NAND string NS includes eight memory cell transistors MT0 to MT7 and two select transistors ST1 and ST2; however, the number of memory cell transistors and the number of select transistors in a NAND string NS may be designed to be any number. Hereinafter, let us assume that a "memory cell transistor MT" refers to each of the memory cell transistors MT0 to MT7.

Each of the memory cell transistors MT0 to MT7 includes a control gate and a charge storage layer, and stores data in a non-volatile manner. The memory cell transistors MT0 to MT7 are coupled in series between a source of the select transistor ST1 and a drain of the select transistor ST2.

The memory cell transistor MT is capable of storing 1-bit data, or data of 2 or more bits. The memory cell transistor MT may be a metal-oxide-nitride-oxide-silicon (MONOS) type, which uses an insulating film as a charge storage layer, or a floating-gate (FG) type, which uses a conductive layer as a charge storage layer.

Gates of select transistors ST1 included in a string unit SU0 are coupled to a select gate line SGD0. Similarly, gates of select transistors ST1 in the string units SU1 to SU3 are respectively coupled to the select gate lines SGD1 to SGD3. The select gate lines SGD0 to SGD3 are independently controlled by the row decoder module 19.

Gates of select transistors ST2 included in the string unit SU0 are coupled to a select gate line SGS. Similarly, gates of select transistors ST2 in the string units SU1 to SU3 are coupled to the select gate line SGS. Individual select gate lines SGS, namely, select gate lines SGS0 to SGS3, may be respectively coupled to the gates of the select transistors ST2 of the string units SU0 to SU3 included in each block BLK. The select transistors ST1 and ST2 are used for selection of a string unit SU in various operations.

Control gates of memory cell transistors MT0 to MT7 included in each block BLK are respectively coupled to word lines WL0 to WL7. The word lines WL0 to WL7 are independently controlled by the row decoder module 19.

Bit lines BL0 to BLi (where i is an integer equal to or greater than 0) are coupled to a plurality of blocks BLK, and are coupled to corresponding NAND strings NS in a plurality of string units SU included in each block BLK. That is, of a plurality of NAND strings NS arranged in a matrix pattern in each block BLK, each of the bit lines BL0 to BLi is coupled to drains of select transistors ST1 of a corresponding set of NAND strings NS in the same column. A source line SL is coupled to a plurality of blocks BLK. That is, the source line SL is coupled to sources of a plurality of select transistors ST2 included in each block BLK.

In short, each string unit SU includes a plurality of NAND strings NS that are coupled to different bit lines BL and coupled to the same select gate line SGD. Moreover, each block BLK includes a plurality of string units SU that share the same word line WL. Furthermore, the memory cell array 11 includes a plurality of blocks BLK that share the same bit line BL.

A block BLK is, for example, a unit of data erasure. That is, data stored in a plurality of memory cell transistors MT included in the same block BLK is collectively erased. Data may be erased in units of string units SU, or may be erased in a unit smaller than a string unit SU.

A plurality of memory cell transistors MT in a single string unit SU that shares the same word line WL will be referred to as a "cell unit CU". A set of 1-bit data items stored in the respective memory cell transistors MT included in a cell unit CU will be referred to as a "page". A cell unit CU changes in its storage capacity according to the number of bits of data stored in the memory cell transistors MT. For example, a cell unit CU stores 1-page data when each memory cell transistor MT stores 1-bit data, stores 2-page data when each memory cell transistor MT stores 2-bit data, and stores 3-page data when each memory cell transistor MT stores 3-bit data.

A write operation and a read operation to and from a cell unit CU are performed on a page-by-page basis. In other words, a read operation and a write operation are collectively performed on a plurality of memory cell transistors MT coupled to a single word line WL provided in a single string unit SU.

For the configuration of the memory cell array 11, a configuration other than the above-described one may be adopted. An example configuration of the memory cell array 11 is described in U.S. patent application Ser. No. 12/407,403 filed on Mar. 19, 2009, entitled "THREE DIMENSIONAL STACKED NONVOLATILE SEMICONDUCTOR MEMORY". Other example configurations are described in U.S. patent application Ser. No. 12/406,524 filed on Mar. 18, 2009, entitled "THREE DIMENSIONAL STACKED NONVOLATILE SEMICONDUCTOR MEMORY"; U.S. patent application Ser. No. 12/679,991 filed on Mar. 25, 2010, entitled "NON-VOLATILE SEMICONDUCTOR STORAGE DEVICE AND METHOD OF MANUFACTURING THE SAME"; and U.S. patent application Ser. No. 12/532,030 filed on Mar. 23, 2009, entitled "SEMICONDUCTOR MEMORY AND METHOD FOR MANUFACTURING SAME". The entire contents of these patent applications are incorporated herein by reference.

1. 2 Structure of Semiconductor Memory Device

Next, an example structure of a semiconductor memory device according to the embodiment will be described.

1. 2. 1 Layout Structure of Semiconductor Memory Device

Figure 3:
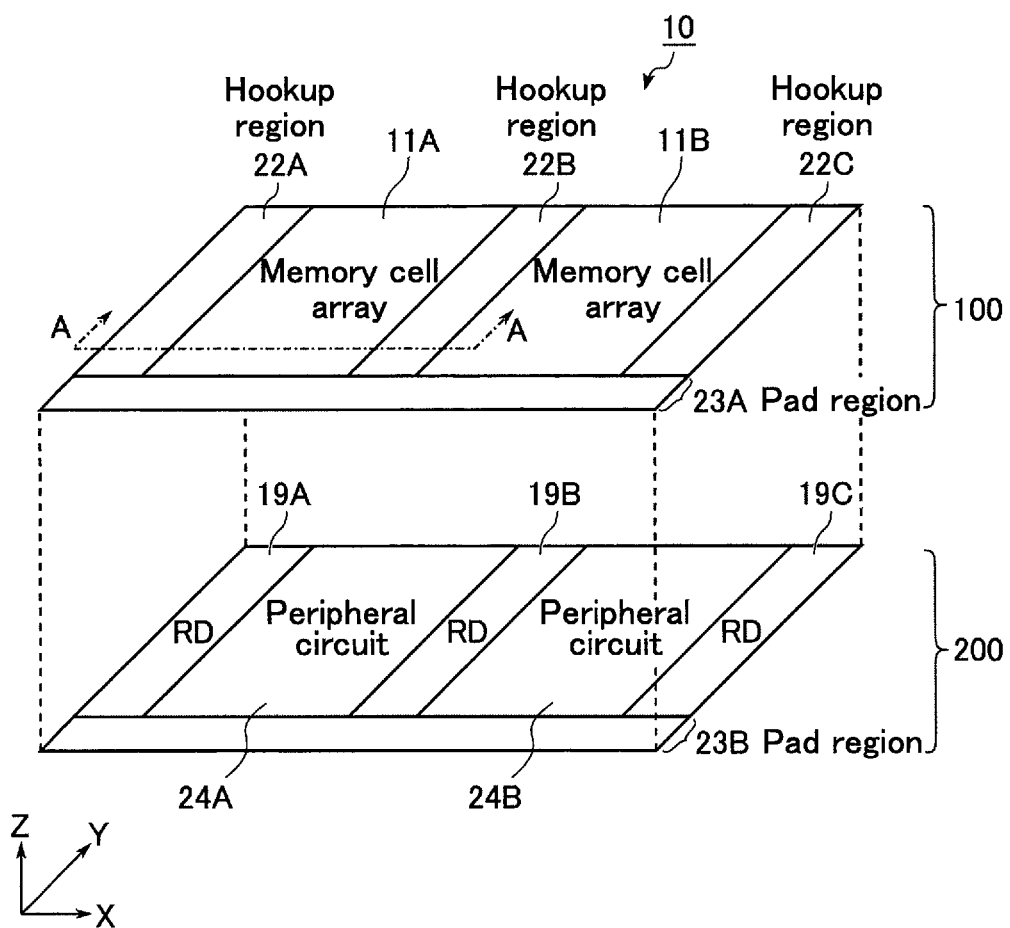
FIG. 3 is a diagram showing an example of a planar layout of the semiconductor memory device according to the embodiment.

An example of a planar layout of the semiconductor memory device 10 will be described with reference to FIG. 3. FIG. 3 shows an example of a planar layout of the semiconductor memory device according to the embodiment. In FIG. 3 and the subsequent drawings, two directions that are parallel to (or that intersect) the plane of a semiconductor substrate (or the plane of a wafer) and are orthogonal to (or that intersect) each other will be referred to as an "X direction" and a "Y direction", and the direction that is orthogonal to (or that intersects) a plane (XY plane) extending along the X and Y directions will be referred to as a "Z direction". The X direction corresponds to the direction in which the word lines WL extend, the Y direction corresponds to the direction in which the bit lines BL extend, and the Z direction corresponds to the direction that is orthogonal to the plane of the semiconductor substrate of the semiconductor memory device 10.

As shown in FIG. 3, the semiconductor memory device 10 includes, for example, a memory array chip 100 and a peripheral circuit chip 200.

The memory array chip 100 includes memory cell arrays 11A and 11B, hookup regions 22A, 22B, and 22C, and a pad region 23A. The memory cell arrays 11A and 11B configure the memory cell array 11. The peripheral circuit chip 200 controls communications with an unillustrated memory controller provided outside, and includes peripheral circuits 24A and 24B, row decoder modules (RD) 19A, 19B, and 19C, and a pad region 23B. The row decoder modules 19A to 19C configure the row decoder module 19. The peripheral circuits 24A and 24B and the row decoder modules 19A to 19C control the memory array chip 100.

The memory array chip 100 and the peripheral circuit chip 200 are formed of different semiconductor substrates. An electrode pad on a surface of the memory array chip 100 and an electrode pad on a surface of the peripheral circuit chip 200 are arranged to face each other, and the electrode pad of the memory array chip 100 and the electrode pad of the peripheral circuit chip 200 are bonded to each other. Thereby, a single semiconductor memory device (semiconductor memory chip) 10 is formed.

In the memory array chip 100, the memory cell arrays 11A and 11B are capable of performing different operations in parallel. The memory cell arrays 11A and 11B are arranged between the hookup regions 22A, 22B, and 22C aligned in the X direction. More specifically, the memory cell array 11A is arranged between the hookup regions 22A and 22B, and the memory cell array 11B is arranged between the hookup regions 22B and 22C.

The hookup regions 22A and 22B are regions for electrically coupling the memory cell array 11A provided in the memory array chip 100 and the row decoder modules 19A and 19B provided in the peripheral circuit chip 200. The hookup regions 22B and 22C are regions for electrically coupling the memory cell array 11B provided in the memory array chip 100 and the row decoder modules 19B and 19C provided in the peripheral circuit chip 200.

The pad region 23A is a region in which a pad used for coupling between the peripheral circuit chip 200 and the memory controller is provided. The pad region 23A extends in the X direction, and is provided adjacent to the memory cell arrays 11A and 11B.

In the peripheral circuit chip 200, the row decoder modules 19A, 19B, and 19C are provided so as to respectively overlap or face the hookup regions 22A, 22B, and 22C of the memory array chip 100. For example, the row decoder modules 19A and 19B are electrically coupled to word lines WL provided in the memory cell array 11A, and the row decoder modules 19B and 19C are electrically coupled to word lines WL provided in the memory cell array 11B.

The peripheral circuit 24A is provided, for example, between the row decoder modules 19A and 19B, and the peripheral circuit 24B is provided, for example, between the row decoder modules 19B and 19C. Each peripheral circuit includes, for example, an input/output circuit 12, a logic control circuit 13, a ready/busy circuit 14, a register group 15, a sequencer 16, a voltage generator 17, a driver 18, a column decoder 20, a sense amplifier module 21, etc.

The pad region 23B is provided so as to be adjacent to the peripheral circuits 24A and 24B, and overlap the pad region 23A of the memory array chip 100. In the pad region 23B, interconnects that are hooked up from the input/output circuits included in the peripheral circuits 24A and 24B, for example, are arranged. These interconnects are hooked up to an upper surface of the semiconductor memory device 10 through vias and pads.

1. 2. 2 Cross-sectional Structure of Semiconductor Memory Device

Figure 4:
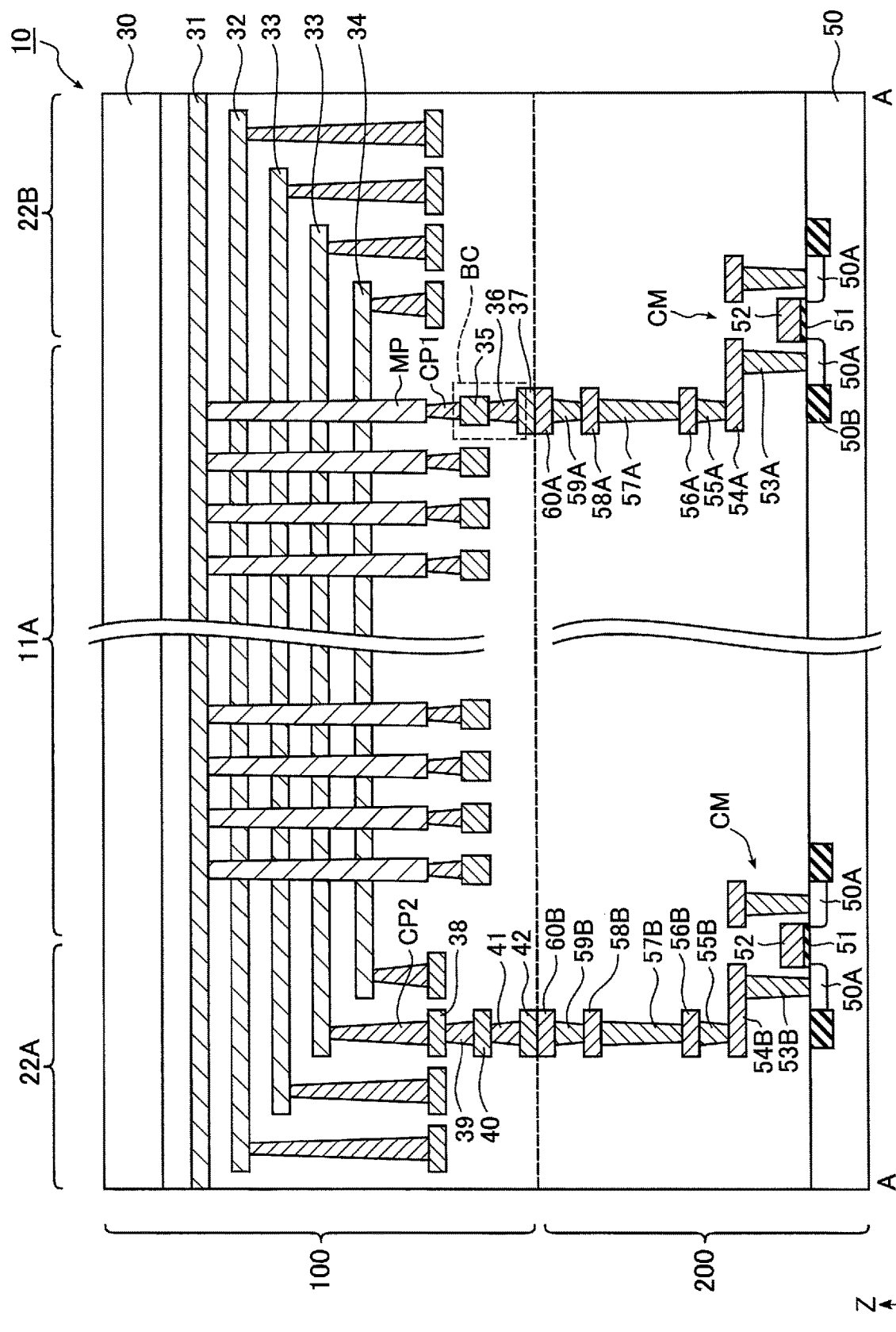
FIG. 4 is a cross-sectional view taken along line A-A of FIG. 3.
Figure 5:
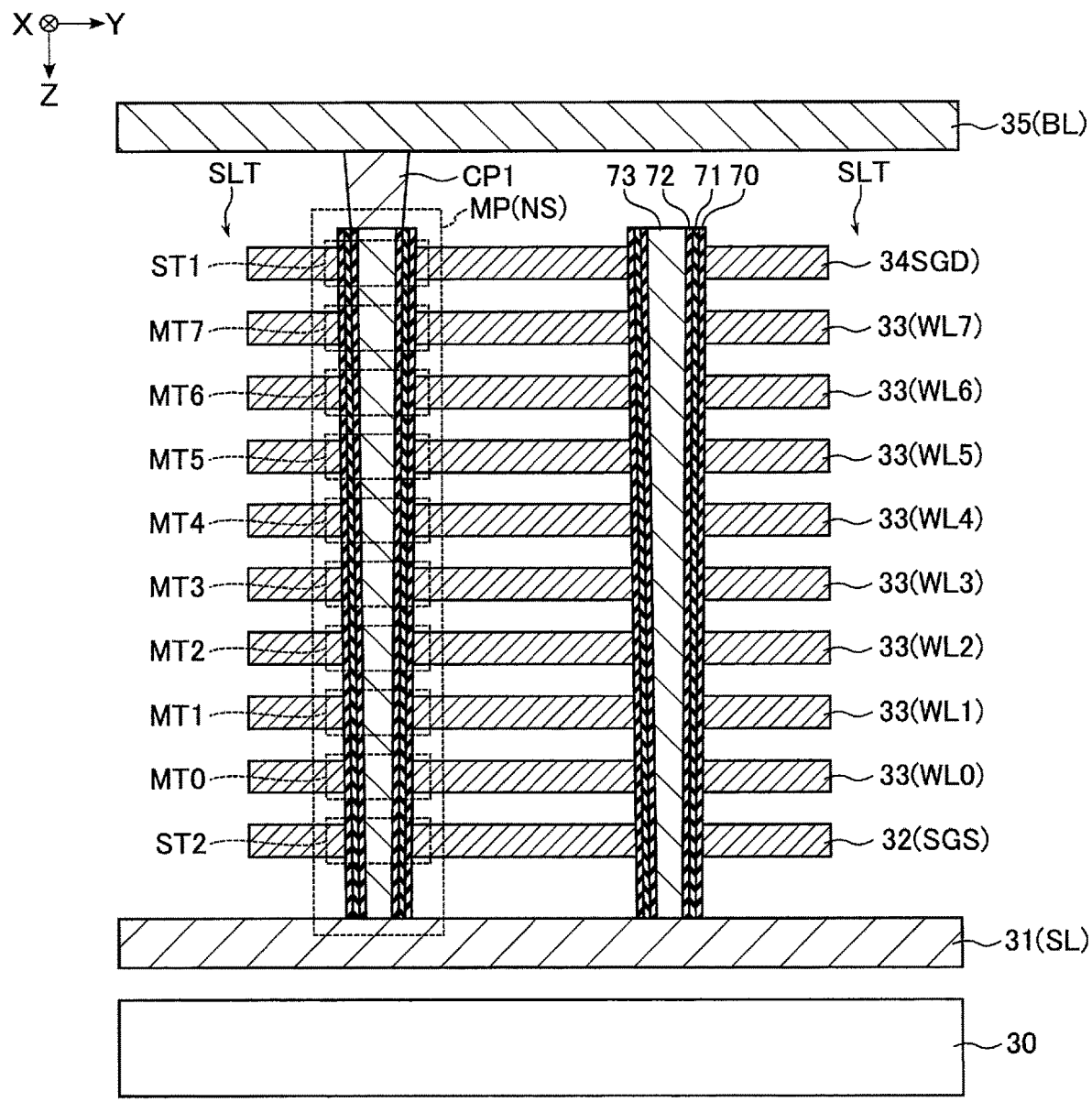
FIG. 5 is a cross-sectional view of memory pillars in the memory cell array according to the embodiment.

Next, a cross-sectional structure of the semiconductor memory device 10 will be described with reference to FIGS. 4 and 5. In FIGS. 4 and 5, illustration of interlayer insulating films between the conductive layers is omitted. In the cross-sectional views of FIGS. 4 and 5, the direction toward which the arrow points along the Z direction will be referred to as a "positive-Z direction", and the direction opposite to the direction toward which the arrow points along the Z direction will be referred to as a "negative-Z direction".

FIG. 4 is a cross-sectional view taken along line A-A of FIG. 3, showing a cross section of the memory cell array 11A, the hookup regions 22A and 22B, the peripheral circuit 24A, and the row decoder modules 19A and 19B cut along the XZ plane.

The semiconductor memory device 10 includes the memory array chip 100 and the peripheral circuit chip 200, as described above.

A cross-sectional structure of the memory array chip 100 will be described in detail below.

A conductive layer 31 is provided on a semiconductor substrate 30 in the negative-Z direction, with an insulating layer interposed therebetween. A layer stack including a conductive layer 32, a plurality of conductive layers 33, and a conductive layer 34 which are stacked in the negative-Z direction, with an insulating layer interposed therebetween, is provided on the conductive layer 31. The conductive layers 31 to 34 extend in the X direction. The conductive layers 31 to 34 have a plate shape extending along (or in parallel with) the XY plane (or the plane of the semiconductor substrate 30).

The conductive layer 31 functions as a source line SL. The conductive layer 32 functions as a select gate line SGS. The conductive layers 33 respectively function as a plurality of word lines WL0 to WL7. In FIG. 4, only two conductive layers 33 are shown, and illustration of the other conductive layers 33 is omitted. The conductive layer 34 functions as a select gate line SGD. The conductive layers 31 to 34 contain, for example, tungsten (W) or polycrystalline silicon. The semiconductor substrate 30 contains, for example, a silicon substrate and a silicon epitaxial layer.

In the layer stack including the conductive layers 32 to 34, a plurality of pillar-shaped memory pillars MP are provided. Each memory pillar MP extends in the Z direction. Each memory pillar MP is arranged to penetrate the conductive layers 32 to 34 in the Z direction (or the direction in which the conductive layers 32 to 34 are stacked), and reach the conductive layer 31 from a surface of the conductive layer 34. That is, each memory pillar MP passes through the select gate line SGD, the word lines WL0 to WL7, and the select gate line SGS, and is coupled to the source line SL.

A contact plug CP1 is provided on each memory pillar MP in the negative-Z direction, and a conductive layer 35 (or a bit line BL) is provided on the contact plug CP1. A via (or a contact plug) 36 and a conductive pad 37 are provided on the conductive layer 35 in this order in the negative-Z direction. Details of the memory pillar MP will be described below.

End portions of the conductive layers 32 to 34 extending in the X direction are electrically coupled to the conductive layer 38 via the contact plug CP2. A via 39, a conductive layer 40, a via 41, and a conductive pad 42 are provided on the conductive layer 38 in this order in the negative-Z direction.

A cross-sectional structure of the peripheral circuit chip 200 will be described below.

On the semiconductor substrate 50, a plurality of CMOS circuits CM each including an n-channel MOS field effect transistor (hereinafter referred to as an "nMOS transistor") and a p-channel MOS field effect transistor (hereinafter referred to as a "pMOS transistor"), for example, are provided. CMOS circuits CM configure a peripheral circuit 24A which controls the operations of a plurality of memory cells and row decoder modules 19A and 19B. The semiconductor substrate 50 includes, for example, a silicon substrate and a silicon epitaxial layer.

As shown in FIG. 4, source and drain regions 50A and element isolation regions 50B are provided on the semiconductor substrate 50. A gate insulating layer 51 is provided on the semiconductor substrate 50 between a pair of source and drain regions 50A in the positive-Z direction, and a gate electrode 52 is provided on the gate insulating layer 51. Each of the nMOS transistor and the pMOS transistor includes a source region 50A, a drain region 50A, a semiconductor layer of a semiconductor substrate 50, a gate insulating layer 51, and a gate electrode 52.

A via 53A is provided on each of the source and drain regions 50A in the positive-Z direction, and a conductive layer 54A is provided on each via 53A. A via 55A, a conductive layer 56A, a via 57A, a conductive layer 58A, a via 59A, and a conductive pad 60A are provided on the conductive layer 54A in this order in the positive-Z direction. The conductive pad 60A is arranged on a surface of the peripheral circuit chip 200 in the positive-Z direction.

A via 53B is provided in each of source and drain regions 50A forming another pair in the positive-Z direction, and a conductive layer 54B is provided on each via 53B. A via 55B, a conductive layer 56B, a via 57B, a conductive layer 58B, a via 59B, and a conductive pad 60B are provided on the conductive layer 54A in this order in the positive-Z direction. The conductive pad 60B is arranged on a surface of the peripheral circuit chip 200 in the positive-Z direction.

The memory array chip 100 and the peripheral circuit chip 200 are bonded to each other in such a manner, for example, that conductive pads including the conductive pad 37 and the conductive pad 60A face each other, and conductive pads including the conductive pad 42 and the conductive pad 60B face each other. Thereby, the conductive pad 37 and the conductive pad 60A are bonded to each other and are electrically coupled to each other. Similarly, the conductive pad 42 and the conductive pad 60B are bonded to each other and are electrically coupled.

Next, a cross-sectional structure of a memory pillar MP (or a NAND string NS) in the memory cell array 11 will be described with reference to FIG. 5. A memory pillar MP includes memory cell transistors MT0 to MT7 and select transistors ST1 and ST2.

FIG. 5 is a cross-sectional view of memory pillars MP in the memory cell array 11 according to the embodiment. In FIG. 5, illustration of interlayer insulating films between the conductive layers is omitted, and the memory pillars MP shown in FIG. 4 are rotated by 180 degrees.

As shown in FIG. 5, the memory cell array 11 includes a semiconductor substrate 30, conductive layers 31 to 34, memory pillars MP, contact plugs CP1, and conductive layers 35. The conductive layer 31 is provided above the semiconductor substrate 30. The conductive layer 31 is formed in a plate shape in parallel with the XY plane, and functions as a source line SL. A principal surface of the semiconductor substrate 30 corresponds to the XY plane.

On the conductive layer 31, a plurality of slits SLT extending along the XZ plane are aligned in the Y direction. A structure (or a layer stack) provided between adjacent slits SLT on the conductive layer 31 corresponds to, for example, a single string unit SU.

A conductive layer 32, a plurality of conductive layers 33, a conductive layer 34, and a conductive layer 35 are provided, in order from the lower layer, between adjacent slits SLT on the conductive layer 31. Of these conductive layers, conductive layers adjacent to each other in the Z direction are stacked with an interlayer insulating film interposed therebetween. The conductive layers 32 to 34 are formed in a plate shape in parallel with the XY plane. The conductive layer 32 functions as a select gate line SGS. The conductive layers 33 respectively function as, in order from the lower layer, word lines WL0 to WL7. The conductive layer 34 functions as a select gate line SGD. The conductive layers 32 to 34 contain, for example, tungsten (W).

The memory pillars MP are arranged in a staggered manner in the X and Y directions. Each of the memory pillars MP extends through (or penetrates) a layer stack between the slits SLT in the Z direction. Each memory pillar MP is provided to penetrate the conductive layers 34, 33, and 32 to reach an upper surface of the conductive layer 31 from an upper surface of the conductive layer 34. Each memory pillar MP functions as a single NAND string NS.

The memory pillar MP includes, for example, a block insulating layer 70, a charge storage layer 71, a tunnel insulating layer (also referred to as a "tunnel insulating film") 72, and a semiconductor layer 73. Specifically, a block insulating layer 70 is provided on an inner wall of a memory hole for forming a memory pillar MP. A charge storage layer 71 is provided on an inner wall of the block insulating layer 70. A tunnel insulating layer 72 is provided on an inner wall of the charge storage layer 71. A semiconductor layer 73 is provided inside the tunnel insulating layer 72. A memory pillar MP may have a structure in which a core insulating layer is provided inside the semiconductor layer 73.

In the above-described configuration of the memory pillar MP, a portion at which the memory pillar MP and the conductive layer 32 intersect each other functions as a select transistor ST2. Portions at which the memory pillar MP and the conductive layers 33 intersect respectively function as memory cell transistors MT0 to MT7. A portion at which the memory pillar MP and the conductive layer 34 intersect each other functions as a select transistor ST1.

The semiconductor layer 73 functions as a channel layer of the memory cell transistors MT and the select transistors ST1 and ST2. A current path of a NAND string NS is formed inside the semiconductor layer 73.

The charge storage layer 71 has a function of storing a charge injected from the semiconductor layer 73 in the memory cell transistor MT. The charge storage layer 71 includes, for example, a silicon nitride film.

The tunnel insulating layer 72 functions as a potential barrier when a charge is injected from the semiconductor layer 73 into the charge storage layer 71, or when a charge stored in the charge storage layer 71 is diffused into the semiconductor layer 73. The tunnel insulating layer 72 includes, for example, a silicon oxide film.

The block insulating layer 70 prevents the charge stored in the charge storage layer 71 from being diffused into the conductive layers 33 (word lines WL). The block insulating layer 70 includes, for example, a silicon oxide layer and a silicon nitride layer.

A plurality of conductive layers 35 are provided above upper surfaces of the memory pillars MP with an interlayer insulating film interposed therebetween. The conductive layers 35 are linear interconnect layers extending in the Y direction, and function as bit lines BL. The conductive layers 35 are aligned in the X direction. One of the conductive layers 35 is electrically coupled to a corresponding memory pillar MP in each string unit SU. Specifically, in each string unit SU, a contact plug CP1 is provided on the semiconductor layer 73 in each memory pillar MP, and a single conductive layer 35 is provided on the contact plug CP1. The conductive layer 35 contains, for example, copper (Cu), aluminum (Al), or tungsten (W). The contact plug CP1 includes a conductive layer of, for example, tungsten (W).

The number of word lines WL and the number of select gate lines SGD and SGS are not limited to the above-described numbers, and may be respectively changed in accordance with the number of memory cell transistors MT and the number of select transistor ST1 and ST2. The select gate line SGS may be configured of a plurality of conductive layers provided in different layers. The select gate line SGD may be configured of a plurality of conductive layers provided in different layers.

1. 2. 3 Structure of Conductive Layers 35 and Vias 36 Coupled to Conductive Layers 35

An example structure of conductive layers 35 (or bit lines BL) and vias (or contact plugs) 36 coupled to the conductive layers 35 shown in the region BC of FIG. 4 will be described with reference to FIGS. 6-8.

FIG. 6 is a plane view of the conductive layers 35 in the semiconductor memory device 10 and the vias 36 coupled to the conductive layers 35. FIG. 6 shows the conductive layers 35 and the vias 36 in the memory array chip 100 as viewed from the positive-Z direction. FIG. 7 is a cross-sectional view taken along line B-B of FIG. 6, showing a cross section of conductive layers 35 and a via 36 cut along the X direction. FIG. 8 is a cross-sectional view taken along line C-C of FIG. 6, showing a cross section of a bit line BL and a via 36 cut along the Y direction.

As shown in FIG. 6, a plurality of conductive layers 35 extend in the Y direction. The conductive layers 35 extending in the Y direction are aligned at a predetermined interval in the X direction. The conductive layers 35 arranged from left to right in FIG. 6 will be respectively denoted as "35_1", "35_2", "35_3" "35_4", and "35_5". A via 36 is arranged on each of the conductive layers 35_1 to 35_5 in the Z direction. Each via 36 extends in the Z direction, and is coupled to an upper surface (or a surface) of each of the conductive layers 35_1 to 35_5, or is in contact with an upper surface of each of the conductive layers 35_1 to 35_5.

Hereinafter, a structure of the via 36 that is coupled to the conductive layer 35_3 will be described. Since each via 36 is coupled to the corresponding conductive layer 35 in a similar manner, a detailed description of such a structure will be omitted. When a conductive layer included in the conductive layers 35_1 to 35_5 does not need to be specified, it will be referred to as a "conductive layer 35".

As shown in FIGS. 7 and 8, the conductive layers 35_1 to 35_5 extend in the Y direction, and are aligned in the X direction. The conductive layers 35_1 to 35_5 are buried in the insulating layer 80 at a predetermined interval in the X direction. A via 36 is provided on each of the conductive layers 35_1 to 35_5, and the conductive layers 35_1 to 35_5 are electrically coupled to the respective vias 36.

An insulating layer 81A is provided on the conductive layers 35_2 to 35_4 and on the insulating layer 80. An insulating layer 82 is provided on the conductive layers 35_1 and 35_5 and on the insulating layer 80. Moreover, an insulating layer 81B is provided on the insulating layer 82, and an insulating layer 83 is arranged on the insulating layer 81B.

In the X and Y directions, a via 36 is provided on the conductive layer 35_3, and is electrically coupled to the conductive layer 35_3. The via 36 is provided to penetrate the insulating layers 83, 81B, and 81A, and reaches an upper surface of the conductive layer 35_3 from the insulating layer 83.

In the X direction, an insulating layer 81A is provided on the conductive layers 35_2 and the conductive layer 35_4, which are adjacent to both sides of the conductive layer 35_3. In the X direction, an insulating layer 82 is provided on the conductive layer 35_1 adjacent to the conductive layer 35_2 and on the conductive layer 35_5 adjacent to the conductive layer 35_4. In the Y direction, the via 36 is provided on the conductive layer 35_3, the insulating layer 81A is provided to sandwich the via 36, and an insulating layer 82 is provided to sandwich the insulating layer 81A. Upper surfaces of the conductive layers 35_2 to 35_4 are recessed from an upper surface of the insulating layer 80. Upper surfaces of the conductive layers 35_1 and 35_5 are not recessed from the upper surface of the insulating layer 80. In other words, the upper surfaces of the conductive layers 35_2 to 35_4 are lower than the upper surface of the insulating layer 80, namely, the upper surfaces of the conductive layers 35_2 to 35_4 are on the side closer to the semiconductor substrate 30 than the upper surface of the insulating layer 80. The upper surfaces of the conductive layers 35_1 and 35_5 are at substantially the same height as the upper surface of the insulating layer 80.

A via 36 is buried in the recess in the insulating layer 80 formed on the conductive layer 35_3. In the recesses in the insulating layer 80 formed on the conductive layers 35_2 and 35_4, an insulating layer 81A is buried.

A diameter or width R1 of a portion of the via 36 that is in the vicinity of the insulating layer 80 or on a side surface of the insulating layer 81A in the X and Y directions is smaller than a diameter or width R2 of a portion of the via 36 that is on the upper surface of the insulating layer 83 in the X and Y directions. For example, the diameter or width R1 of the via 36 in the vicinity of the insulating layer 80 is equal to or smaller than ½ of the diameter or width R2 of the via 36 on the upper surface of the insulating layer 83. The insulating layer 81A is provided between the conductive layer 35_2 and the via 36, and between the conductive layer 35_4 and the via 36.

An example has been described of a via 36 that has a circular shape in the top view shown in FIG. 6; however, the shape of the via 36 is not limited thereto, and may be an oblong or oval shape having a longer diameter in the Y direction.

1. 2. 4 Method of Manufacturing Conductive Layers 35 and Vias 36 A method of manufacturing the conductive layers 35 and the vias 36 coupled to the conductive layers 35 shown in FIGS. 7 and 8 will be described with reference to FIGS. 9 to 24. FIGS. 9 to 24 are cross-sectional views showing a method of manufacturing the conductive layers 35 and the vias 36 according to the embodiment.

Figure 9:
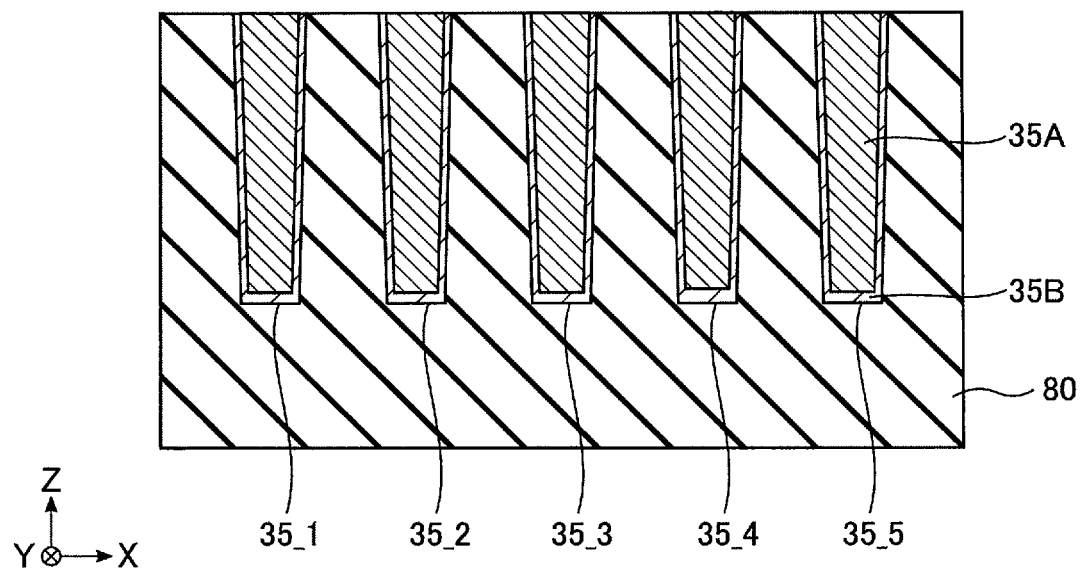
Figure 10:
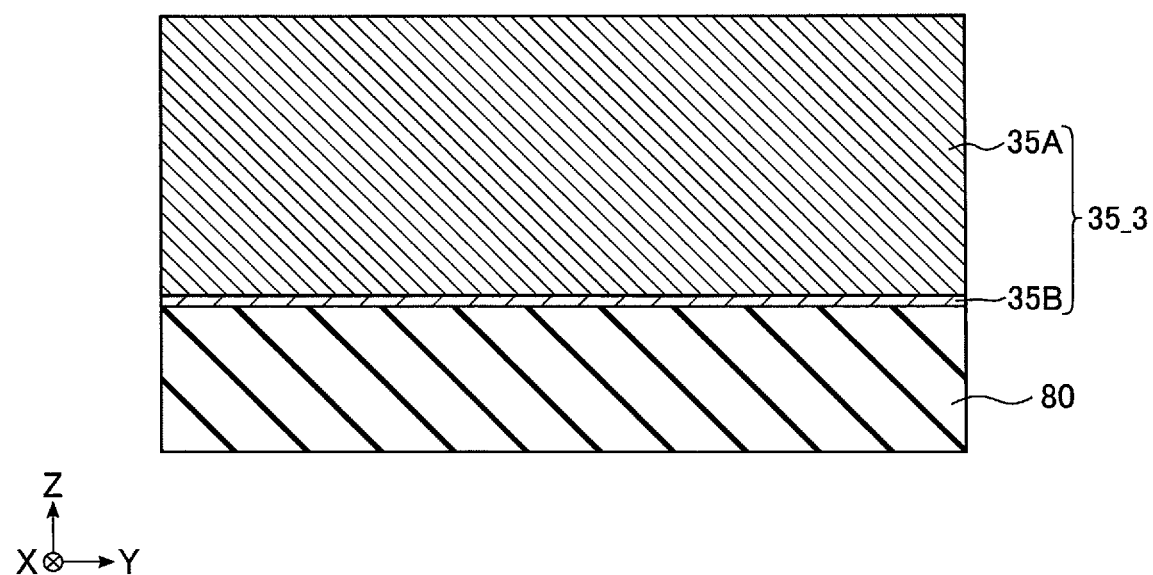

First, as shown in FIGS. 9 and 10, conductive layers 35_1 to 35_5 are formed in an insulating layer 80. Specifically, interconnect grooves are formed in the insulating layer 80 by a reactive-ion etching (RIE) technique. Subsequently, barrier metals 35B are formed on bottom surfaces and side surfaces of the interconnect grooves by a chemical vapor deposition (CVD) technique. Thereafter, metal materials 35A, such as copper (Cu), are formed on portions of the barrier metal 35B that are on the bottom surfaces and the side surfaces of the interconnect grooves by CVD, and the interconnect grooves are filled with the copper. Thereby, the conductive layers 35_1 to 35_5 are formed in the interconnect grooves in the insulating layer 80. The metal materials 35A of the conductive layers 35 contain, for example, copper (Cu), aluminum (Al), or titanium (Ti). The barrier metals 35B contain, for example, titanium. The insulating layer 80 contains, for example, a silicon oxide layer.

Figure 11:
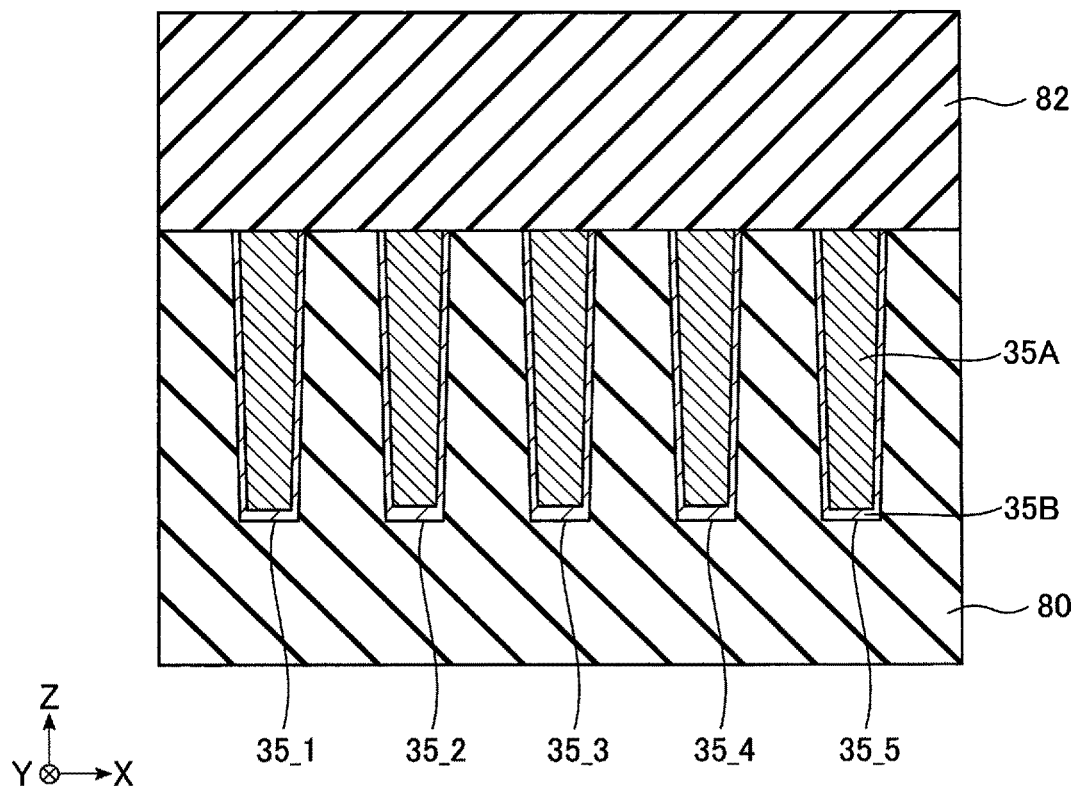
Figure 12:
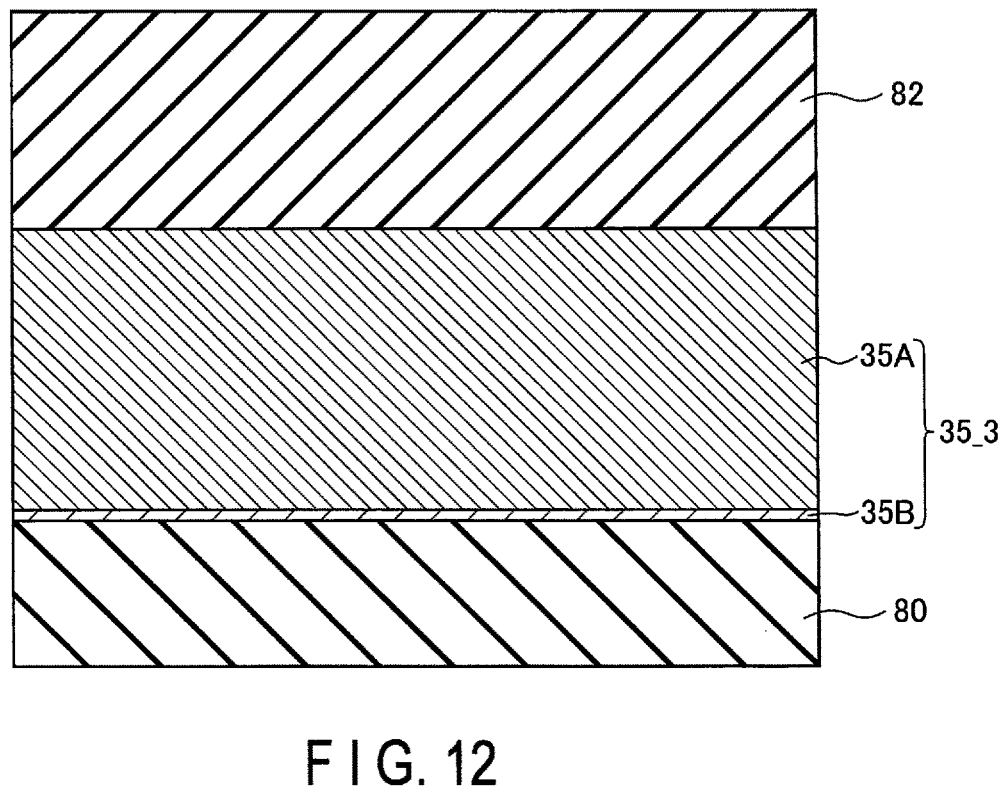

Subsequently, an insulating layer 82 is formed by CVD on the conductive layers 35_1 to 35_5 and on the insulating layer 80, as shown in FIGS. 11 and 12. Thereafter, portions of the insulating layer 82 that are on the conductive layers 35_2 to 35_4 and between the conductive layers 35_2 and 35_4 are removed by RIE, as shown in FIGS. 13 and 14. Thereby, an opening in the insulating layer 82 is formed on the conductive layers 35_2 to 35_4. For the insulating layer 82, a material that displays a high selectivity to a silicon oxide layer during etching is employed. The insulating layer 82 contains, for example, a silicon nitride layer or a silicon carbon nitride layer.

Thereafter, as shown in FIGS. 15 and 16, portions of the conductive layers 35_2 to 35_4 that are exposed from the opening of the insulating layer 82 are removed to a predetermined depth by means of, for example, wet etching. Thereby, upper surfaces of the conductive layers 35_2 to 35_4 are recessed from the upper surface of the insulating layer 80, as indicated by 80A.

Subsequently, as shown in FIGS. 17 and 18, an insulating layer 81 is formed on the structure shown in FIGS. 15 and 16 by means of CVD. Specifically, an insulating layer 81 is formed on the conductive layers 35_2 to 35_4, on a portion of the insulating layer 80 that is between the conductive layers 35_2 and 35_4, and on the insulating layer 82. At this time, a ratio of a length of the opening of the insulating layer 82 in the X direction, a thickness of the insulating layer 82, and a thickness of the insulating layer 81 is 3:2:1. Accordingly, the insulating layer 81 is formed on the insulating layer 80 between the conductive layers 35_2 and 35_4 to have a thickness corresponding to the ratio "1". The insulating layer 81 contains the same material as the insulating layer 82, such as a silicon nitride layer or a silicon carbon nitride layer.

Subsequently, as shown in FIGS. 19 and 20, an insulating layer 83 is formed on the structure shown in FIGS. 17 and 18, by means of CVD. Specifically, an insulating layer 83 is formed on portions of the insulating layer 81 that are above the conductive layers 35_1 to 35_5. At this time, a cavity may be formed on the portion of the insulating layer 81 that is on the conductive layer 353 and the insulating layer 83. The insulating layer 83 contains, for example, a silicon oxide layer.

Figure 21:
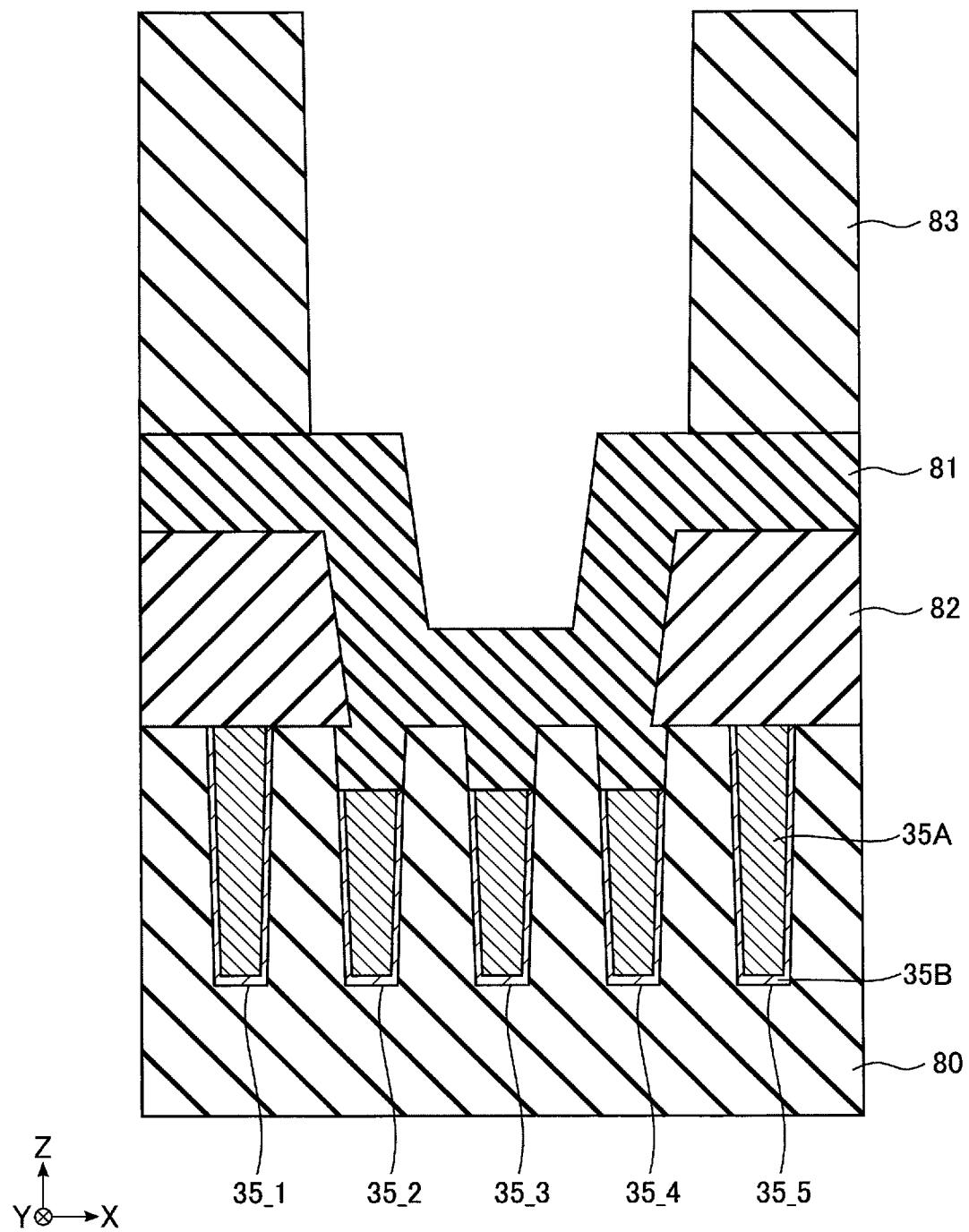

Next, as shown in FIGS. 21 and 22, a portion of the insulating layer 83 that is on the insulating layer 81 and above the conductive layers 35_2 to 35_4 is removed by means of lithography and RIE. Thereby, a portion of the insulating layer 81 that is on the conductive layers 35_2 to 35_4 is exposed.

Subsequently, as shown in FIGS. 23 and 24, the insulating layer 81 is etched by performing RIE on the structure shown in FIGS. 21 and 22. This causes a portion of the insulating layer 81 that is located on the conductive layer 35_3 to be removed, thus exposing an upper surface of the conductive layer 35_3. Thereby, a hole for a via that reaches the upper surface of the conductive layer 35_3 from an upper surface of the insulating layer 83 is formed. At the same time, the insulating layer 81A remains on the conductive layer 35_2 and on a side surface of the insulating layer 82, and the insulating layer 81A remains on the conductive layer 35_4 and on a side surface of the insulating layer 82. Also, the insulating layer 81B remains between the insulating layer 82 and the insulating layer 83.

Thereafter, a conductive layer is buried in the hole for the via, and a via 36 is formed in the hole for the via on the conductive layer 35_3, as shown in FIGS. 7 and 8. Thereby, the conductive layer 35_3 and the via 36 are electrically coupled. With the above-described manufacturing steps, a via 36 coupled to the conductive layer 35_3 and the conductive layer 35_3 is manufactured.

1. 3 Advantageous Effects of Embodiment

According to the present embodiment, it is possible to provide a semiconductor memory device capable of improving the reliability of operation.

Advantageous effects of the embodiment will be described below.

According to the embodiment, the semiconductor memory device includes an insulating layer 80 provided on the semiconductor substrate 30; a conductive layer 35_3 provided in the insulating layer 80; a conductive layer 35_4 provided adjacent to the conductive layer 35_3 in the insulating layer 80; and a via (or contact plug) 36 coupled to an upper surface of the conductive layer 35_3. In the Z direction orthogonal to the semiconductor substrate 30, upper surfaces of the conductive layers 35_3 and 35_4 that overlap the via 36 are lower in height than an upper surface of the insulating layer 80. With the above-described structure, a distance between the upper surface of the conductive layer 35_4 and the via 36 can be increased. It is thereby possible to improve the withstand voltage between the conductive layer 35_4 and the via 36.

In addition, in the present embodiment, only upper portions of the conductive layers 35_3 and 35_4 that are in a region that overlaps the via 36 in the Z direction are removed, instead of removing the entirety of the upper portions (or upper surfaces) of the conductive layers 35_3 and 35_4. Thereby, it is possible to suppress the increase in the electric resistance of the conductive layers 353 and 35_4 due to reduce the thicknesses of the conductive layers 35_3 and 35_4.

When the entirety of the upper portions of the conductive layers 35_3 and 35_4 are removed, some portions of the conductive layers 35_3 and 35_4 may be excessively removed. In the present embodiment, only upper portions of the conductive layers 35_3 and 35_4 that are in a region in which a via 36 is provided in the Z direction are partially removed. It is thus possible to reduce the instances in which some portions of the conductive layers 35_3 and 35_4 are excessively removed. It is thereby possible to reduce the occurrences of rapid increases of the electric resistance of the conductive layers 35_3 and 35_4, decoupling, etc., thus improving the yield in the manufacturing of the semiconductor memory device.

In addition, by preparing a hole for forming a via 36 in advance in the insulating layers 83 and 81 and then forming a hole for exposing the conductive layer 35_3, as shown in FIGS. 21 and 22, it is possible to decrease the diameter or width of the via 36. It is thereby possible to increase the distance between the via 36 and the conductive layer 35_4, thus improving the withstand voltage between the via 36 and the conductive layer 35_4. Similarly, it is possible to increase a distance between the via 36 and the conductive layer 35_2 adjacent thereto, thus improving the withstand voltage between the via 36 and the conductive layer 35_2.

With the above-described configuration, it is possible in the present embodiment to provide a semiconductor memory device capable of improving the reliability of operation.

1. 4 Modifications

Figure 25:
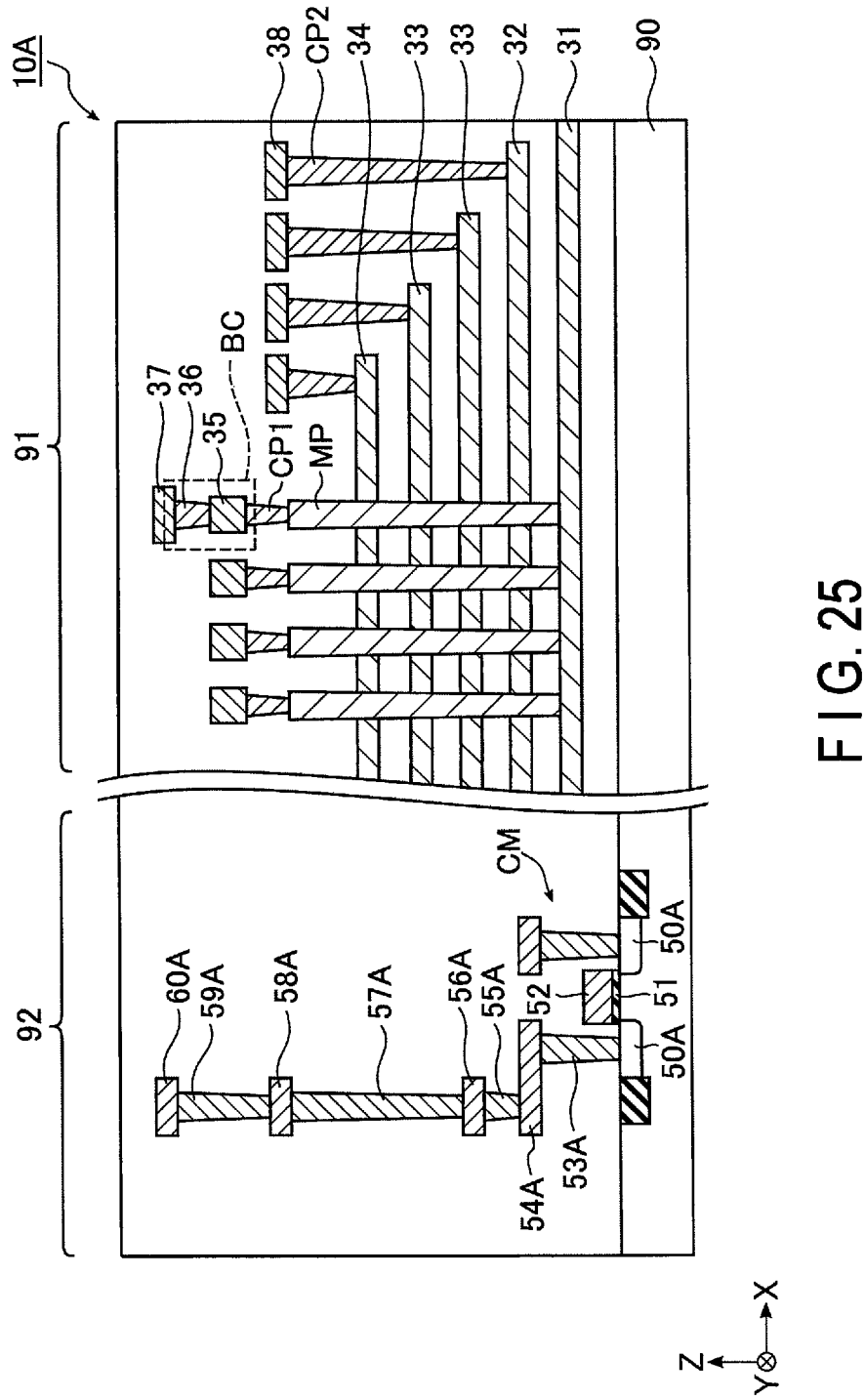
FIG. 25 is a cross-sectional view of a semiconductor memory device according to a modification.

In the above-described embodiment, an example has been described of a semiconductor memory device 10 in which a memory array chip 100 and a peripheral circuit chip 200 are bonded; however, the embodiment is not limited thereto, and is applicable to a semiconductor memory device 10A in which a region 91 including memory cells and a region 92 including peripheral circuits are provided on a single semiconductor substrate 90, as shown in FIG. 25.

Moreover, in the above-described embodiment, an example has been described of a NAND flash memory as a semiconductor memory device; however, the embodiment is not limited to a NAND flash memory, and is applicable to other semiconductor memories in general. Furthermore, the present embodiment is applicable to various memory devices other than a semiconductor memory.

The embodiments described above are merely shown as examples, and are not intended to limit the scope of the invention. These embodiments may be implemented in various other forms, and various omissions, replacements, and changes can be made without departing from the gist of the invention. The embodiments and their modifications are included in the scope and spirit of the invention and are included in the scope of the claimed inventions and their equivalents.

What is claimed is:

1. A semiconductor memory device comprising:
   a first insulating layer;
   a plurality of bit lines extending in a first direction and arranged in a second direction intersecting the first direction, the plurality of bit lines including a first bit line and a second bit line adjacent to the first bit line in the second direction;
   a contact plug coupled to a first surface of the first bit line in a third direction intersecting the first and second directions, wherein
   the first bit line includes a first portion overlapping the contact plug in the third direction and a second portion not overlapping the contact plug in the third direction, the second bit line includes a third portion overlapping the contact plug in the third direction and a fourth portion not overlapping the contact plug in the third direction,
a thickness in the third direction of the first portion is smaller than a thickness in the third direction of the second portion in the first bit line,
a thickness in the third direction of the third portion is smaller than a thickness in the third direction of the fourth portion in the second bit line,
a third bit line provided in the first insulating layer, extending in the first direction, and provided adjacent to the second bit line on a side opposite to the first bit line with respect to the second bit line in the second direction,
wherein the thicknesses in the third direction of the first portion and the third portion are smaller than the thickness in the third direction of the third bit line,
a fourth bit line provided in the first insulating layer, extending in the first direction, and provided on a side opposite to the second bit line with respect to the first bit line in the second direction, and
wherein a thickness in the third direction of a portion of the fourth bit line that overlaps the contact plug in the third direction is smaller than thicknesses in the third direction of the second portion and the fourth portion.

2. The semiconductor memory device according to claim 1, wherein
the contact plug has a pillar shape extending in the third direction, and a first cross- sectional area taken along the first and second directions of a first portion of the contact plug is smaller than a second cross-sectional area taken along the first and second directions of a second portion of the contact plug, the first portion of the contact plug being close to the first bit line, the second portion of the contact plug being far from the first bit line, compared to the first cross-sectional area.

3. The semiconductor memory device according to claim 1, further comprising:
a second insulating layer provided between the second bit line and the contact plug.

4. The semiconductor memory device according to claim 1, further comprising:
a plurality of first conductive layers stacked in the third direction and provided on a side of a second surface of the first bit line opposite to the first surface of the first bit line on a side of the contact plug in the third direction; and
a pillar penetrating the first conductive layers in the third direction, and electrically coupled to the first hit line.

5. The semiconductor memory device according to claim 4, wherein
a portion at which each of the first conductive layers and the pillar intersect functions as a memory cell transistor.

6. The semiconductor memory device according to claim 1, further comprising:
a first circuit provided on a side opposite to the first bit line with respect to the contact plug in the third direction, and electrically coupled to the contact plug; and
a substrate which is provided on a side opposite to the contact plug with respect to the first circuit in the third direction and in which the first circuit is formed.

7. A semiconductor memory device comprising:
a first insulating layer;
a plurality of bit lines extending in a first direction and arranged in a second direction intersecting the first direction, the plurality of bit lines including a first bit line;
a first contact plug coupled to a first surface of the first bit line in a third direction intersecting the first direction and the second direction; and
a second contact plug provided above the first surface of the first bit line in the third direction,
wherein the first bit line includes a first portion overlapping the first contact plug in the third direction, a second portion overlapping the second contact plug in the third direction, and a third portion not overlapping either the first contact plug or the second contact plug in the third direction,
a first thickness in the third direction of the first portion is smaller than a second thickness in the third direction of the third portion in the first bit line,
a third thickness in the third direction of the second portion is smaller than the second thickness in the first bit line,
a second bit line provided in the first insulating layer, extending in the first direction, and provided adjacent to the first bit line in the second direction,
wherein a thickness in the third direction of a portion of the second bit line that overlaps the first contact plug in the third direction is smaller than a thickness in the third direction of a portion of the second bit line that does not overlap the first contact plug in the third direction,
a third bit line provided in the first insulating layer, extending in the first direction, and provided on a side opposite to the second bit line with respect to the first bit line in the second direction, and
wherein a thickness in the third direction of a portion of the third bit line that overlaps the first contact plug in the third direction is smaller than a thickness in the third direction of a portion of the third bit line that does not overlap the first contact plug in the third direction.

8. The semiconductor memory device according to claim 7, wherein
the first contact plug has a pillar shape extending in the third direction, and a first cross-sectional area taken along the first and second directions of a first portion of the first contact plug is smaller than a second cross-sectional area taken along the first and second directions of a second portion of the first contact plug, the first portion of the first contact plug being close to the first bit line, the second portion of the first contact plug being far from the first bit line, compared to the first cross-sectional area.

9. The semiconductor memory device according to claim 8, further comprising: a second insulating layer provided between the second bit line and the first contact plug.

10. The semiconductor memory device according to claim 7, further comprising:
a plurality of first conductive layers stacked in the third direction and provided on a side of a second surface of the first bit line opposite to the first surface on a side of the first contact plug in the third direction; and
a pillar penetrating the first conductive layers in the third direction, and electrically coupled to the first bit line.

11. The semiconductor memory device according to claim 10, wherein
a portion at which each of the first conductive layers and the pillar intersect functions as a memory cell transistor.

12. The semiconductor memory device according to claim 7, further comprising:
- a first circuit provided on a side opposite to the first bit line with respect to the first contact plug in the third direction, and electrically coupled to the contact plug; and
- a substrate which is provided on a side opposite to the first contact plug with respect to the first circuit in the third direction and in which the first circuit is formed.

* * * * *